United States Patent [19]

Beilstein, Jr. et al.

[11] Patent Number: 5,466,634
[45] Date of Patent: Nov. 14, 1995

[54] ELECTRONIC MODULES WITH INTERCONNECTED SURFACE METALLIZATION LAYERS AND FABRICATION METHODS THEREFORE

[75] Inventors: Kenneth E. Beilstein, Jr., Essex Junction; Claude L. Bertin, So. Burlington; John E. Cronin, Milton; Wayne J. Howell, Williston; James M. Leas, So. Burlington, all of Vt.; Robert B. Phillips, Staatsburg, N.Y.

[73] Assignee: International Business Machines Corporation, Armonk, N.Y.

[21] Appl. No.: 359,982

[22] Filed: Dec. 20, 1994

[51] Int. Cl.$^6$ .................................................. H01L 21/44
[52] U.S. Cl. ........................ 437/180; 437/205; 437/208; 437/209; 437/915
[58] Field of Search ......................... 437/180, 205, 437/208, 209, 211, 212, 215, 216, 217, 218, 219, 220, 221, 222, 915

[56] References Cited

U.S. PATENT DOCUMENTS

| | | | |
|---|---|---|---|
| 4,304,624 | 12/1981 | Carson et al. | 156/630 |
| 4,352,715 | 10/1982 | Carson et al. | 156/634 |
| 4,525,921 | 7/1985 | Carson et al. | 29/577 |
| 4,551,629 | 11/1985 | Carson et al. | 250/578 |
| 4,672,737 | 6/1987 | Carson et al. | 437/208 |
| 4,737,470 | 4/1988 | Bean | 437/205 |
| 4,794,092 | 12/1988 | Solomon | 437/51 |
| 4,880,699 | 11/1989 | Kohn | 428/333 |
| 4,908,266 | 3/1990 | Kohn | 428/333 |
| 4,908,267 | 3/1990 | Kohn | 428/333 |
| 4,910,083 | 3/1990 | Kohn | 428/333 |
| 4,983,533 | 1/1991 | Go | 437/208 |
| 4,999,311 | 3/1991 | Dzarnoski, Jr. et al. | 437/51 |
| 5,071,694 | 12/1991 | Uekita et al. | 428/216 |
| 5,106,461 | 4/1992 | Volfson et al. | 437/180 |
| 5,107,586 | 4/1992 | Eichelberger et al. | 437/211 |
| 5,198,888 | 3/1993 | Sugano et al. | 437/209 |
| 5,279,029 | 1/1994 | Burns | 437/205 |
| 5,281,852 | 1/1994 | Normington | 437/209 |
| 5,380,681 | 1/1995 | Hsu | 437/209 |
| 5,426,566 | 6/1995 | Beilstein, Jr. et al. | 437/915 |

*Primary Examiner*—Brian E. Hearn
*Assistant Examiner*—Kevin M. Picardat
*Attorney, Agent, or Firm*—Heslin & Rothenberg

[57] ABSTRACT

Methods of fabrication for electronic modules having electrically interconnected side and end surface metallization layers and associated electronic modules are set forth. The methods include providing a stack comprising a plurality of stacked IC chips. A side surface thin-film metallization layer is formed on the stack. Next, an end surface thin-film metallization layer is formed the stack such that the side surface and end surface thin-film metallization layers directly electrically interconnect. Alternatively, each IC chip of a stack may include an end surface metallization layer such that separate formation of an end surface metallization layer on an end surface of the stack is unnecessary. The methods also include forming an electronic module by first providing a long stack of IC chips, testing the chips of the stack, and then segmenting the long stack into multiple small stacks of functional IC chips based upon the test results. Specific details of electronic modules, IC chips contained therein, and stacks composed thereof are also set forth.

32 Claims, 15 Drawing Sheets

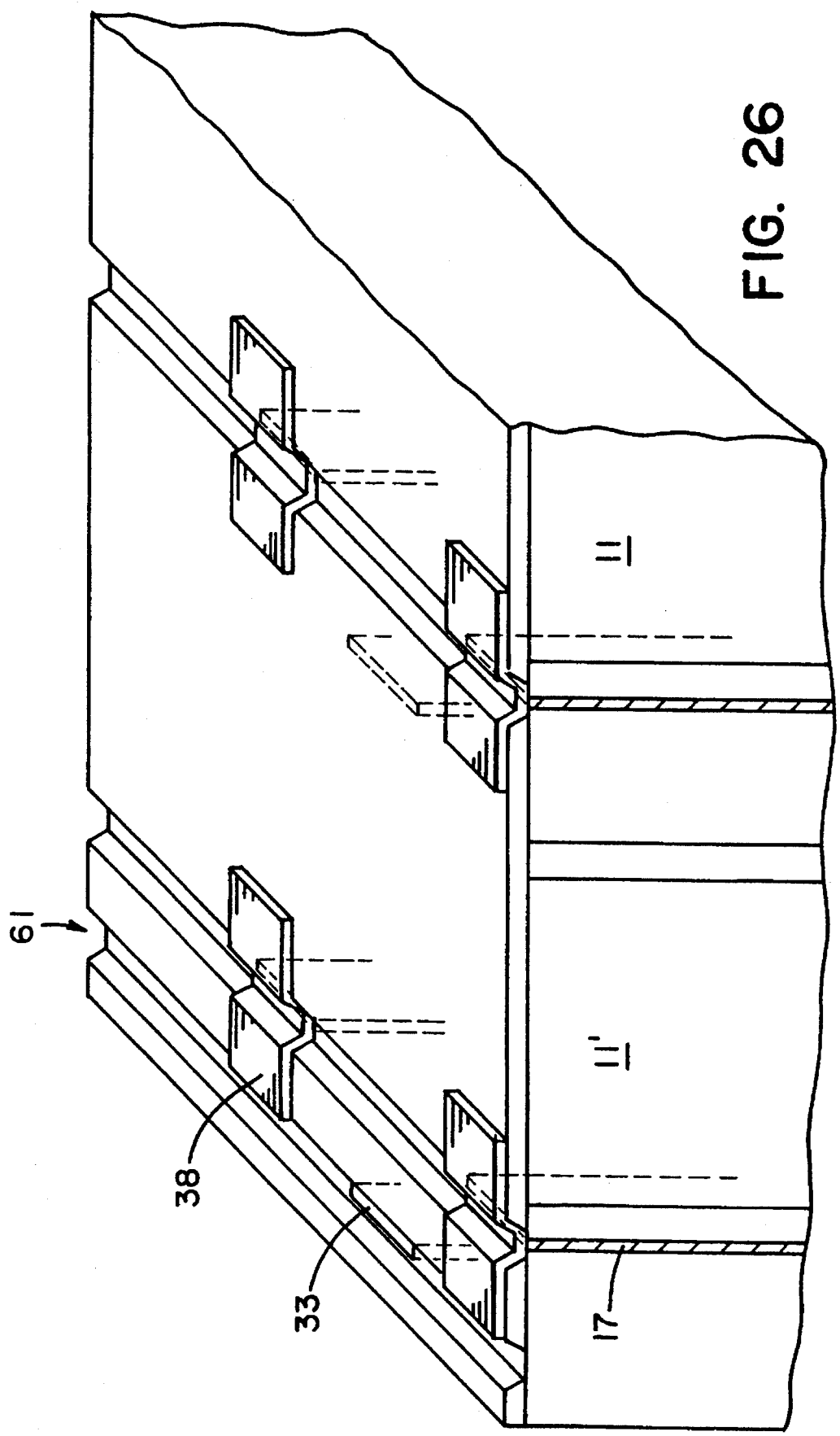

ELECTRONIC MODULES WITH INTERCONNECTED SURFACE METALLIZATION LAYERS AND FABRICATION METHODS THEREFORE

TECHNICAL FIELD

The present invention relates in general to high density electronic packaging. More particularly, this invention relates to a technique for fabricating and interconnecting metallization layers on the surfaces of an electronic module comprising a densely stacked array of multiple semiconductor chips. The invention also relates to a technique for subdividing a "long stack" of semiconductor chips into multiple "small stacks" of functional semiconductor chips to facilitate the formation of multiple electronic modules.

BACKGROUND OF THE INVENTION

Since the development of integrated circuit ("IC") technology, computers and computer storage devices have been made from IC chips formed from wafers of semiconductor material. After a wafer is made, the chips are typically separated from each other by dicing the wafer. Thereafter, the individual chips are bonded to carriers of various types, interconnected by wires and packaged. Such "two-dimensional" packages of chips fail to optimize the number of circuits that might be fabricated in a given space, and also introduce undesirable signal delays, capacitance, and inductance as signals travel between chips.

Recently, electronic modules comprising three-important packaging approach. A typical three-dimensional electronic module consists of multiple IC chips adhesively secured together as a "stack." A metallization layer is often provided directly on a side surface of the electronic module, the side surface being defined in part by the edge surfaces of the IC chips of the stack. The side surface metallization layer interconnects the chips in the stack and facilitates electrical connection of the stack to circuitry external to the module. Specifically, the metallization layer can include both individual contacts and bus contacts.

The overall dimensions of an electronic module need to be minimized in order to fit into industry standard packages, with the smallest being the most highly valued. A typical application involves next generation memory chips (e.g., 64 million bit dynamic random access memories, i.e. "64 Mbit DRAMs") which contain four times the number of bits, with the same control functions, as the previous generation of memory chips (e.g., 16 Mbit DRAMs). This can be accomplished only when the advancement of semiconductor tools and processes allow significant (2×) reduction in geometries. An alternative to waiting for the requisite advances in single chip semiconductor tools and processes is to combine existing memory chips (16 Mbit) so they emulate next generation (64 Mbit) memory chips. Chip "stacking" technology provides just such a means. For example, a 64 Mbit memory chip function may be created by "stacking" four 16 Mbit memory chips and one buffer chip. However, this electronic module must fit into the space of a single 64 Mbit memory chip. Thus, dimensional minimization is important to the success of this technology. However, current "stacking" technologies fail to provide the minimization required.

The means used to interconnect the modules to external electrical circuitry effects the overall size of electronic modules. In addition to the side surface connection scheme previously mentioned, connection can be made through an end surface of an electronic module defined by a substantially planar main surface of an end semiconductor chip in the stack. Interconnection to external circuitry from an end surface of an electronic module is typically performed by the use of a "thick" ceramic end cap. The front surface of the end cap contains metallized contacts for external connection.

Ceramic end cap techniques significantly increase the size of the electronic modules. A "thick" end cap is necessary primarily due to the use of "T-connects" on the side surface of the electronic module (corresponding to the edge surface of the end cap) to reliably connect side surface metallization to back surface "transfer wiring" on the end cap. The end cap must be thick enough (i.e., the edge of the end cap must be wide enough) to accommodate the side surface T-connections. Thus, end caps increase the size of electronic modules in which they are contained.

Ceramic end caps also pose wiring density problems because they generally use thick-film wiring. The wiring ground rules for currently used thick-film wiring are much larger than those used for thin-film wiring. For long stacks, the wiring density required on the end cap could exceed the minimum wiring width and spacing for thick-film technology. While thin-film wiring could be used, the addition of thin-film wiring to "thick" end caps is costly and complex. Thus, the "thick" end cap increases the size of the module and restricts the number of IC chips it can contain.

The interconnect between IC chips and a thick ceramic end cap is complex and costly. Specifically, electrically conductive vias originating from the contacts on the front surface of the end cap are etched completely through to the back surface of the end cap. Back surface transfer metallization then extends from the vias to the edges of the end cap (corresponding to side surfaces of the module) to facilitate connection to the side surface metallization layer.

A particular set of problems is related to forming insulating layers in association with surface metallization layers on surfaces of stacks of IC chips. Current insulator layer deposition techniques for electronic modules usually involve spin applying a liquid to a stack's surface(s). This creates several problems including: large (as a percentage of the total area and film-thickness) edge effects on individual stacks and tight balancing requirements for multiple stack spinning in a single fixture. Unique and expensive fixtures to minimize edge effects and to properly balance multiple stack insulator spin application could be implemented, but this solution increases costs. These problems are exacerbated when attempting to process small stacks (herein defined as stacks of IC chips with fewer IC chips than "long" stacks).

Currently, formation of small stacks may involve the formation of a "long stack," and subsequent division thereof into multiple small stacks. This is performed at pre-defined locations within the long stack. For example, if a small stack is to include four electrically-good, burned-in memory chips and an end cap, then one must add additional IC chips in each small stack to allow for burn-in and process chip losses such that an adequate yield of four good IC chips within the small stack is ensured. Thus, each small stack within the long stack may consist of, for example, six memory chips and an end cap. Segmentation of the long stack into small stacks is therefore performed between the end cap of one small stack and the first chip of a next small stack.

Clearly, the current long stack/small stack structure has several limitations associated therewith. Referring to the small stack including four primary memory chips and two "spare" memory chips, if the "spare" chips are not needed then the small stack includes two electrically-good, burned-in chips that are never used. Moreover, inclusion of "spare"

chips detrimentally increases the overall size of the electronic module. Similarly, if burn-in and cube processing result in less than four good chips in a small stack, the entire small stack is discarded. Thus, the remaining electrically-good, burned-in chips (between 0 and 3) are lost. In total, the current technique of segmenting a long stack at predefined segmentation points results in unnecessary loss of electrically-good, burned-in chips, with all the commensurate impacts on product cost.

The present invention is directed towards solving all the above noted problems.

DISCLOSURE OF THE INVENTION

The present invention comprises, in a first aspect, a method for forming an electronic module. The method includes providing a stack comprising a plurality of stacked IC chips such that the edge surfaces of the IC chips at least partially define a first surface of the stack. A first thin-film metallization layer is formed on the first surface of the stack, and a first insulating layer is formed thereabove. Next, a second thin-film metallization layer is formed above a second surface of the stack, the second surface being perpendicular to the first surface and having the first thin-film metallization layer extending thereto. The second thin-film metallization layer extends beyond the first surface of the stack so as to electrically connect to the first thin-film metallization layer.

As an enhancement, the first insulating layer may be formed by applying multiple insulating layers to the first surface of the stack above the first thin-film metallization layer. Similarly, prior to the formation of the first thin-film metallization layer, a second insulating layer may be formed by sequentially transferring multiple thin-film insulating layers to the second surface of the stack. The second insulating layer facilitates formation of the second thin-film metallization layer thereon.

As further enhancements, prior to forming the second thin-film metallization layer, the second insulating layer may be thinned and the second thin-film metallization layer may be formed on the thinned second insulating layer. Further, after the second thin-film metallization layer is formed, the first insulating layer may be thinned exposing the second thin-film metallization layer on the thinned surface of the first insulating layer.

In another aspect, the present invention comprises a method for forming an electronic module. The method includes providing a stack comprising a plurality of stacked IC chips. At least two IC chips of the stack, including an end IC chip, have a main surface, a transfer metallization layer disposed above the main surface and an end surface metallization layer disposed above the main surface. Further, each IC chip of the stack has an edge surface. The edge surfaces of the IC chips at least partially define a side surface of the stack. Next, a first metallization layer is formed on the side surface of the stack such that the first metallization layer electrically interconnects at least some of the stacked IC chips. Further, the first metallization layer is formed such that it electrically connects to the end surface metallization layer of the end IC chip of the stack. Thus, external electrical connection to the electrically interconnected IC chips is facilitated through the end surface metallization layer of the end IC chip of the stack. The stack and the first metallization layer together comprise an electronic module.

As an enhancement, forming the first metallization layer further includes exposing the end surface metallization layer of the end IC chip of the stack. The end surface metallization layer is exposed on the side surface of the stack (towards which it extends) such that electrical contact can be made from the first metallization layer thereto. Further, IC chips of the stack may be provided with their end surface metallization layers disposed above their transfer metallization layers for facilitating separate electrical connection to the metallization layers from the side surface of the stack.

Another aspect of the present invention includes a method for forming an electronic module. The method comprises providing a long stack including a first plurality of stacked IC chips wherein each IC chip of a second plurality of IC chips of the long stack is separable from an adjacent IC chip within the long stack. After providing the long stack, at least one segmentation point is determined therewithin and is locatable between any IC chips of the second plurality of IC chips and an adjacent IC chip. The long stack is then separated into at least two small stacks at the segmentation point, wherein one of the two small stacks comprises the electronic module.

As an enhancement, the method may include testing each IC chip of the long stack and determining a segmentation point based thereupon. Further, after the testing, the method may include forming a first metallization layer on a side surface of the long stack. The first metallization layer may have a pattern based upon the results of the testing step such that the electronic module comprises an interconnected plurality of stacked functional IC chips.

In summary, the techniques of the present invention facilitate the formation of electronic modules with interconnected side and end surface metallization layers without the need for a "thick" end cap. Further, the techniques described herein facilitate an overall reduction in the size of electronic modules, advantageously facilitating their inclusion in smaller electronic packages.

In one embodiment, the techniques of the present invention facilitate the formation of electrically interconnected side and end surface thin-film metallization layers on an electronic module. Insulating layers associated with the respective side and end surfaces may be thinned, thus reducing the overall dimensions of the electronic module.

In another embodiment, a long stack of IC chips is tested, and segmented into multiple small stacks of IC chips. The long stack is fabricated such that segmentation can be performed between any two adjacent chips. Thus, after the testing steps, small stacks of comprising only functional IC chips may be formed. This facilitates the elimination of "spare" IC chips within electronic modules, which reduces their overall size. Furthermore, when combined with the electrically interconnected side surface to end surface metallization layer techniques of the present invention, a fully interconnected, full functional and reduced size electronic module is formed.

The present invention further comprises techniques for forming electronic modules wherein each IC chip of the module includes both a transfer metallization layer and an end surface metallization layer. The end surface metallization layer is used on the end IC chip of the stack. Thus, an electronic module may be created with an end surface metallization layer without adding end surface structures to the stack of IC chips comprising the module. Overall dimensions of the module are therefore reduced. Further, these techniques may be combined with the aforementioned long stack/small stack segmentation processes described herein such that the requirement for spare IC chips in the stack is eliminated.

Advantageously, the synergistic techniques of the present invention described herein facilitate the formation of advanced electronic modules having interconnected surface metallization layers and reduced overall dimensions.

BRIEF DESCRIPTION OF THE DRAWINGS

The subject matter which is regarded as the present invention is particularly pointed out and distinctly claimed in the concluding portion of the specification. The invention, however, both as to organization and method of practice, together with further objects and advantages thereof, may best be understood by reference to the following detailed description taken in conjunction with the accompanying drawings in which:

FIG. 26 is a side perspective view of the small stack of FIG. 25 after fabrication of T-connects associated with each IC chip's transfer metallization according to an embodiment of the present invention;

BEST MODE FOR CARRYING OUT THE INVENTION

The present invention includes an electronic module having electrically interconnected side and end surface metallization layers. To that end, certain preferred embodiments for establishing interconnected side and end surface metallization layers on an electronic module are presented herein. Unless otherwise noted the techniques described heerinbelow apply to both long and small stacks of IC chips.

Figure 1:
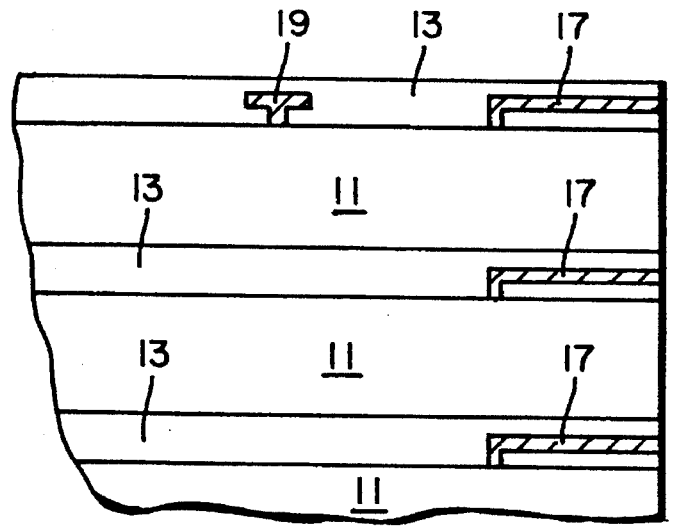
FIG. 1 is a partial cross-sectional view of a stack of multiple IC chips laminated together according to an embodiment of the present invention.

FIG. 1 is a partial cross-sectional view of a stack of IC chips 11 formed in a substantially right parallelepiped shape. Typical functions implemented by IC chips 11 may include, for example, memory and/or control functions so as to form a memory module. However, each chip may include any function known in the art for implementation on an IC chip. Transfer metallization 17 is associated with each IC chip of the stack and are used to connect the IC chips to other chips in the stack or to external circuitry. When stacked, transfer metallization 17 of chips 11 extends to at least one selected side surface of the stack of IC chips. Insulator 13, disposed on the surface of each chip 11 both above and below transfer metallization 17, electrically insulates and physically isolates the respective transfer metallization. The IC chips are laminated together via thin layers of adhesive (not shown).

As a specific example, the stack of chips may comprise a memory module, with each IC chip 11 having a respective insulating layer 13, such as a polyimide, formed above the active surface of each of the IC chips. Insulator 13 also electrically insulates the respective transfer metallization 17, which may comprise a Ti/Al(Cu) structure. Transfer metals 17 electrically connect to the active input/output ("I/O") pads of the respective chips by conventional metallized vias formed in the insulator 13. The transfer metallization layer also includes contact pads 19 which facilitate electrical contact from I/O pads on the end IC chip of the stack to electrical contacts later formed on the end surface of the module (connection is made using vias through insulator 13—see, for example, FIG. 8). The thin layers of adhesive (not shown) may comprise any one of various commercially available high-temperature adhesive materials, such as Thermid manufactured by National Starch and Chemical Co., Bridgewater, N.J.

Figure 2:
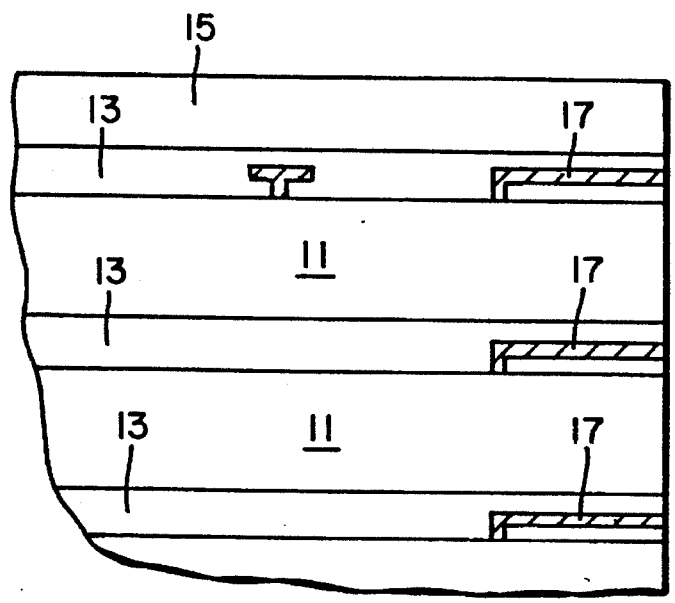
FIG. 2 is a partial cross-sectional view of the stack of FIG. 1 subsequent to the formation of a thick insulating layer on an end surface thereof pursuant to one embodiment of the present invention.

Processing then continues with the deposition of thick insulating film 15 (e.g., 25–50 μm of polyimide) on an end surface of the "stack" (FIG. 2). In order to avoid substantial edge beading of deposited polyimide and to increase uniformity, the "thick" insulator may be fabricated by sequentially applying multiple "thin" insulating layers to the end surface using techniques disclosed in U.S. Pat. No. 4,880,699, entitled "Ultra-Thin Polyimide Polymer Films and Their Preparation," issued Nov. 14, 1989 and hereby incorporated herein by reference. These techniques facilitate the development of a thin liquid film of insulator within a ring (or alternative shape). Liquid film surface forces allow the film to develop and last long enough to be deposited/transferred to the end surface of the stack. Transfer is thus accomplished by either passing the stack through the liquid film or by touching the film to the stack and then withdrawing the ring. This film transfer technology results in extremely uniform thin films without substantial edge beading. Thus, processing near edges is not degraded. In addition, the large quantity of wasted material resulting from the use of conventional spin apply technology is eliminated. Thus, processing costs are further reduced.

Figure 11:
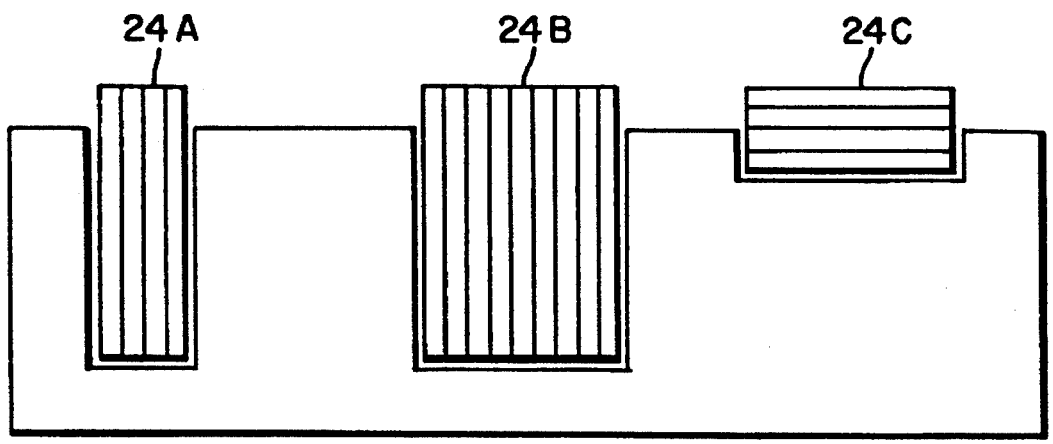
FIG. 11 is a cross-sectional view of a multi-up stack processing fixture according to one embodiment of the present invention.

Thin-film insulating layer application technology facilitates simultaneous processing of multiple stacks within a single fixture. The "multi-up" fixture of FIG. 11 is designed to facilitate simultaneous processing of three stacks. This figure is meant to provide examples of the various sizes, types and orientations of IC chip stacks that can be processed simultaneously. Other sizes, types and orientations of IC chip stacks are also possible.

Specifically, the fixture containing multiple stacks is passed through, or touched to, a thin-film of insulator. The thin-film of insulation is thus transferred to the exposed horizontal surfaces 24A–C (i.e., the "up" surface, hence "multi-up" processing) of the three stacks. It should be noted that the three horizontal surfaces 24A–C of the three stacks are substantially coplanar, thus facilitating simultaneous contact of all three surfaces to a thin-film layer of insulator.

Figure 3:
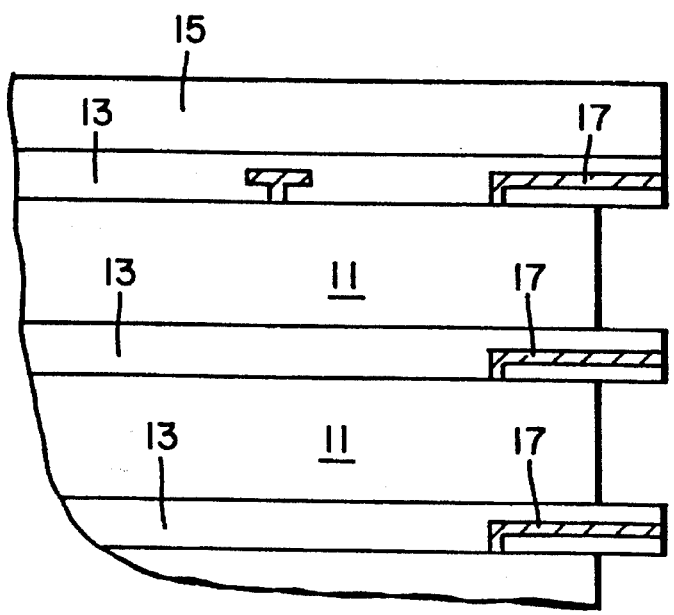
FIG. 3 is a partial cross-sectional view of the stack of FIG. 2 subsequent to preferential etching of a side surface of the stack pursuant to one embodiment of the present invention.
Figure 4:
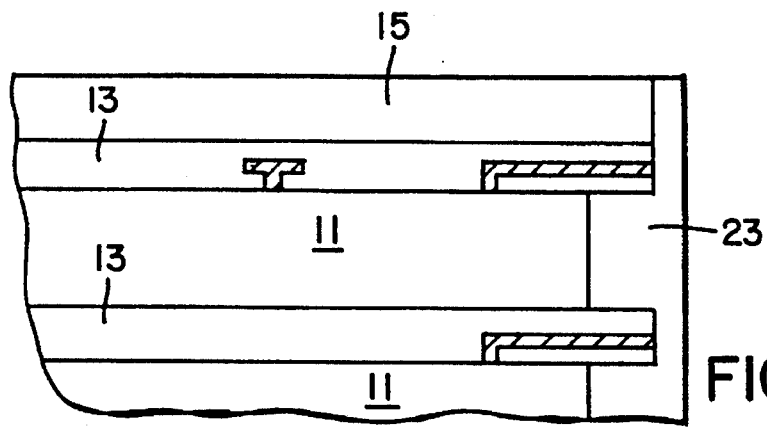
FIG. 4 is a partial cross-sectional view of the stack of FIG. 3 subsequent to the formation of an insulating layer on the etched side surface in conformance with an embodiment of the present invention.
Figure 5:
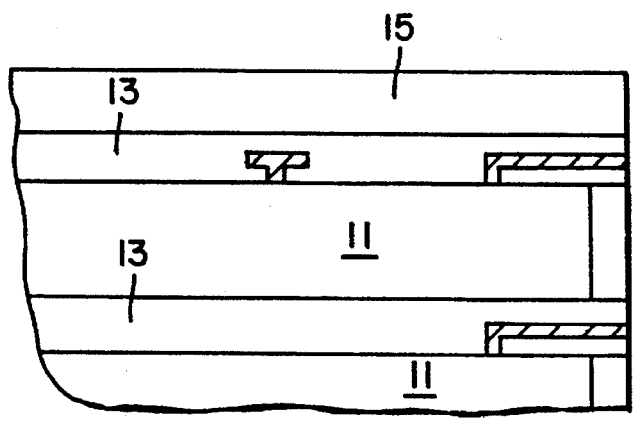
FIG. 5 is a partial cross-sectional view of the stack of FIG. 4 after planarization of the insulated side surface to expose the ends of the transfer metals according to one embodiment of the present invention.

As a specific process example, once end surface insulator 15 had been applied, a selected side surface undergoes processing to expose the ends of transfer metallization 17. The edges of chips 11 are preferentially removed (FIG. 3), e.g., using a selective etch process. Thereafter, an insulating layer is deposited (FIG. 4) and removed to expose only the ends of the transfer metallization 17 (FIG. 5).

Figure 6:
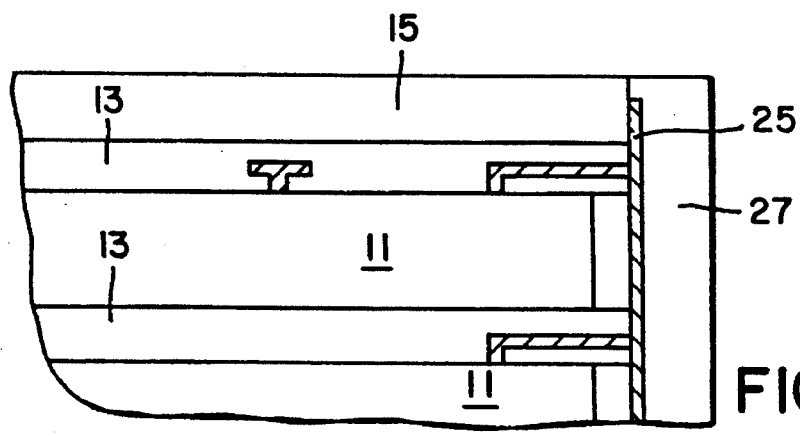
FIG. 6 is a partial cross-sectional view of the stack of FIG. 5 subsequent to the formation of a side surface metallization layer and a thick side surface insulating layer according to an embodiment of the present invention.

Side surface metallization layer 25 is then formed on a selected side surface of the module (FIG. 6). Specifically, side surface metallization layer 25 may comprise a thin-film metallization layer which is patterned to electrically connect to transfer metallization 17, interconnecting the IC chips of the stack. Depositing the thin-film metallization layer results in the formation of T-connects 38 which electrically couple metallization layer 25 to transfer metallization 17. As a typical process example, thin-film side surface metallization is formed using standard photolithographic thin-film apply techniques. Next, side surface insulating layer 27 is formed as a "thick" (25–50 μm) layer using, for example, the aforementioned thin-film insulating layer transfer techniques.

Figure 30:
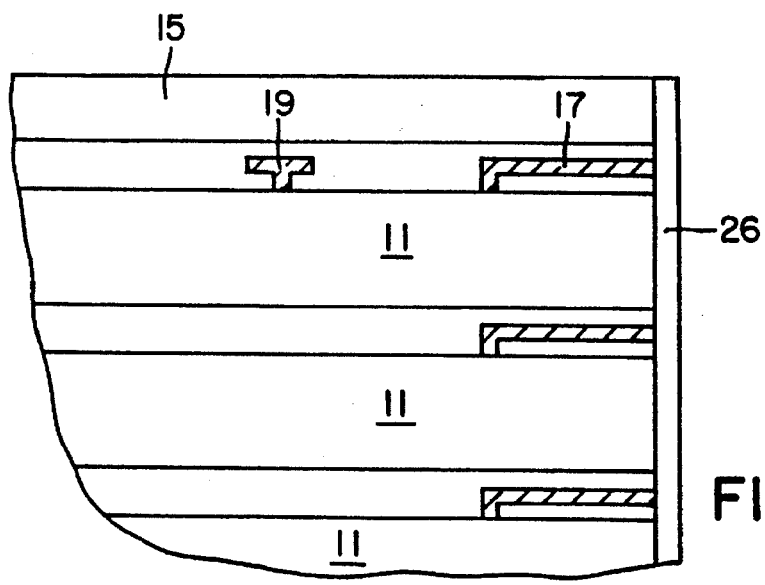
FIG. 30 is a partial cross-sectional view of the stack of FIG. 2 subsequent to the formation of a thin side surface insulating layer according to an embodiment of the present invention.
Figure 31:
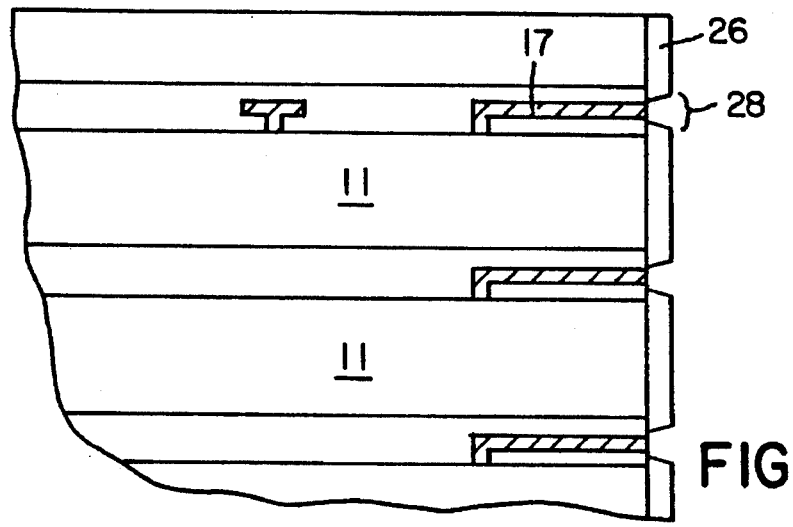
FIG. 31 is a partial cross-sectional view of the stack of FIG. 30 subsequent to the patterned formation of openings in the thin side surface insulating layer.
Figure 32:
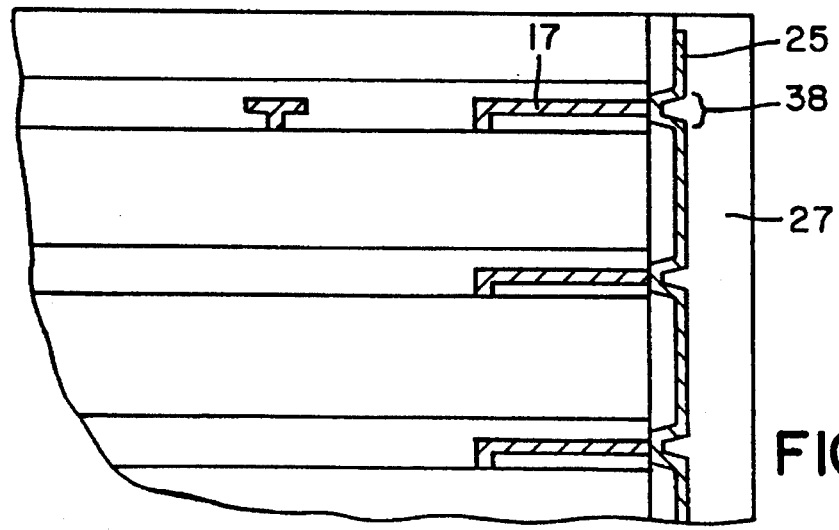
FIG. 32 is a partial cross-sectional view of the stack of FIG. 31 subsequent to the formation of a side surface metallization layer and a protective insulating layer thereabove.

Another method for forming a side surface metallization layer on a stack of IC chips is described hereinbelow. A selected side surface of the stack of chips of FIG. 2 is planarized, exposing the ends of transfer metallization 17. Thereafter, thin insulating layer 26 is deposited on the planarized side surface of the module (FIG. 30). Standard photolithographic processing is then used to open vias 28 in thin insulating layer 26 exposing the ends of transfer metallization 17 (FIG. 31). Thin-film side surface metallization layer 25 is then deposited, and covered by thick insulating layer 27. Depositing of the thin-film metallization layer results in the formation of T-connects 38 which electrically couple metallization layer 25 to transfer metallization 17. As in previous embodiments discussed hereinabove, thin-film insulating layer transfer techniques may be used to form thin insulating layer 26 and thick insulating layer 27.

Figure 7:
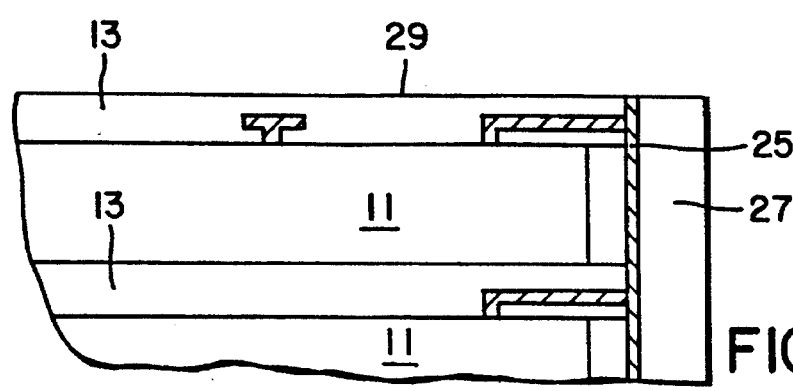
FIG. 7 is a partial cross-sectional view of the stack of FIG. 6 subsequent to the selective etching and polishing of the end surface of the module to expose the side surface metallization layer, in conformance with one embodiment of the present invention.
Figure 8:
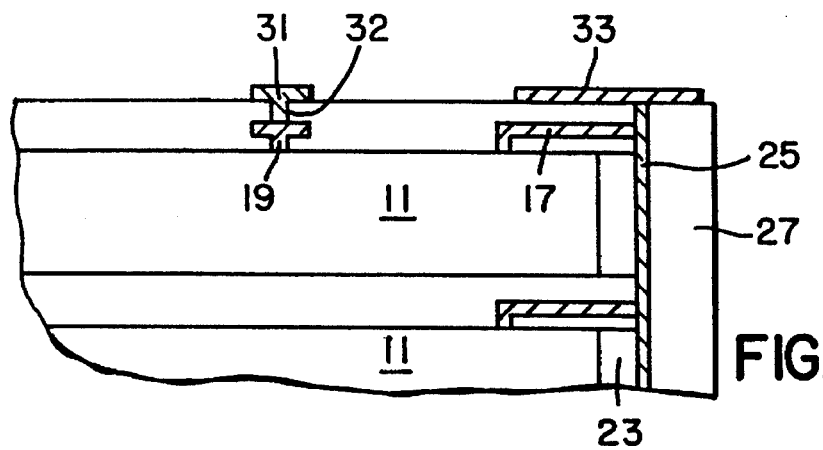
FIG. 8 is a partial cross-sectional view of the stack of FIG. 7 subsequent to the formation of an end surface metallization layer which is electrically connected to the side surface metallization layer pursuant to an embodiment of the present invention.

Subsequent to the formation of side surface metallization layer 25 and associated insulating layer 27, the stack can be reoriented in a multi-up fixture to expose the end surface of the stack. In fact, many "stacks" may be processed simultaneously using a single "multi-up" fixture (FIG. 11). Chemical and/or mechanical methods are then used to reduce the thickness of end surface insulator 15, exposing the end of side surface metallization layer 25 (FIG. 7). Specifically, preferential etch and mechanical polishing techniques as previously discussed herein may be employed to thin the end surface insulator to a thickness of, for example, less than 10 µm. In fact, end surface insulating layer 15 may even be completely removed (FIG. 7). Standard photolithographic and thin-film apply technology is then used to form end surface metallization layer 33 and electrical contact(s) 31 (FIG. 8). As shown, end surface metallization layer 33 is connected to side surface metallization 25. As a general note, prior to the formation of electrical contacts 31, standard patterned etching techniques are used to form vias 32 to transfer metallization contacts 19 which contact I/O pads on the end IC chip. Thus, a completed electronic module is formed having side surface metallization layer 25 interconnected using T-connect 38 to end surface metallization layer 33 having end surface external contact 31.

Figure 9:
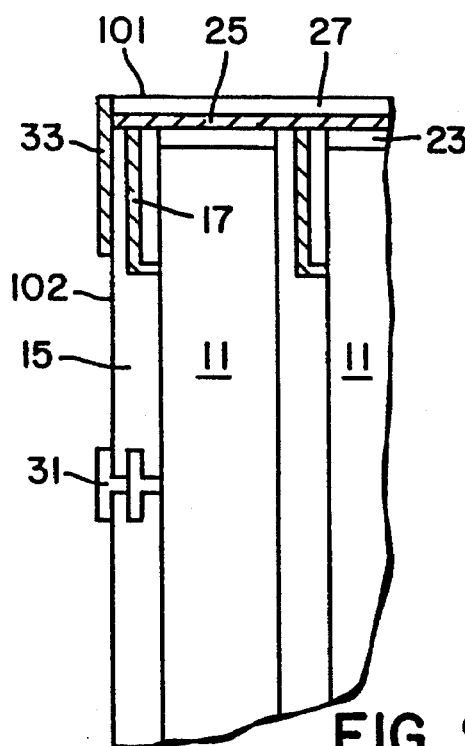
FIG. 9 is a partial cross-sectional view of the stack of FIG. 8 subsequent to preferential etching of the side insulating layer according to an embodiment of the present invention.
Figure 10:
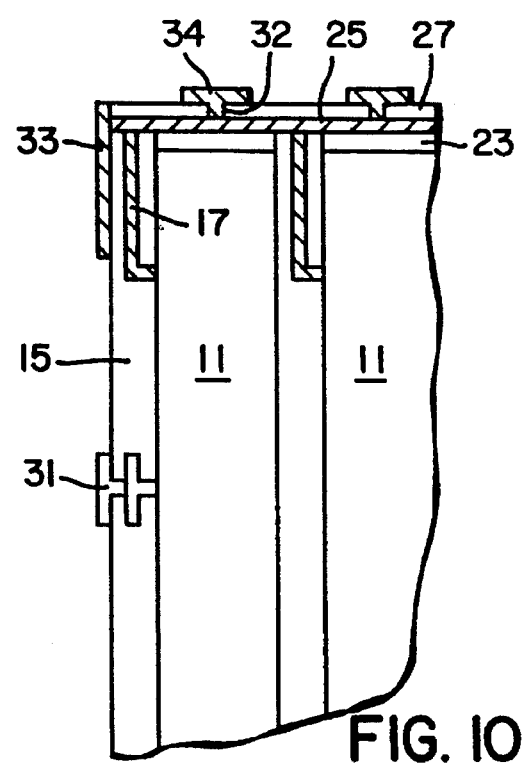
FIG. 10 is a partial cross-sectional view of the stack of FIG. 9 subsequent to the formation of vias and electrical contacts on the side surface of the stack in conformance with one embodiment of the present invention.

The techniques of the present invention may be extended to form an electronic module with electrical contacts on both end and side surfaces. As a specific process example, the stack of chips is reoriented to facilitate processing of the side surface 101 associated with thin-film metallization layer 25 (FIG. 9). Again, using chemical and/or mechanical techniques, "thick" side insulator layer 27 is thinned to achieve the desired thickness (approximately, for example, 2–8 µm above side surface metallization 25). Insulating layer 27 is deposited thick to provide space for the cross-member of the T-connect (i.e., the top half) and can be left thick, but if side surface pads 34 are desired, it is best thinned so via 32 is not too deep. Thinning also reduces the overall size of the electronic module. Vias 32 are formed in thinned side insulating layer 27 as part of side surface metallization layer 34 which comprises multiple electrical contacts (FIG. 10). This layer (contacts) is deposited using techniques similar to those used to form end surface contacts 31 hereinabove.

Thus, an electronic module is formed having interconnected side surface 101 and end surface 102 metallization layers as well as side and end surface external electrical contacts. Furthermore, the thickness associated with both side insulating layer 27 and end insulation layer 15 has been reduced to shrink the electronic module's dimensions.

Figure 12:
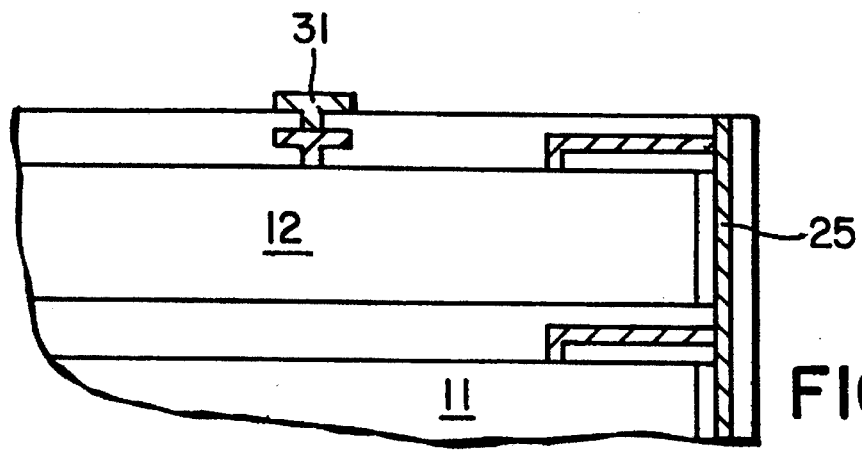
FIG. 12 is a partial cross-sectional view of a completed electronic module having an integral buffer chip contained therein pursuant to one embodiment of the present invention.
Figure 14:
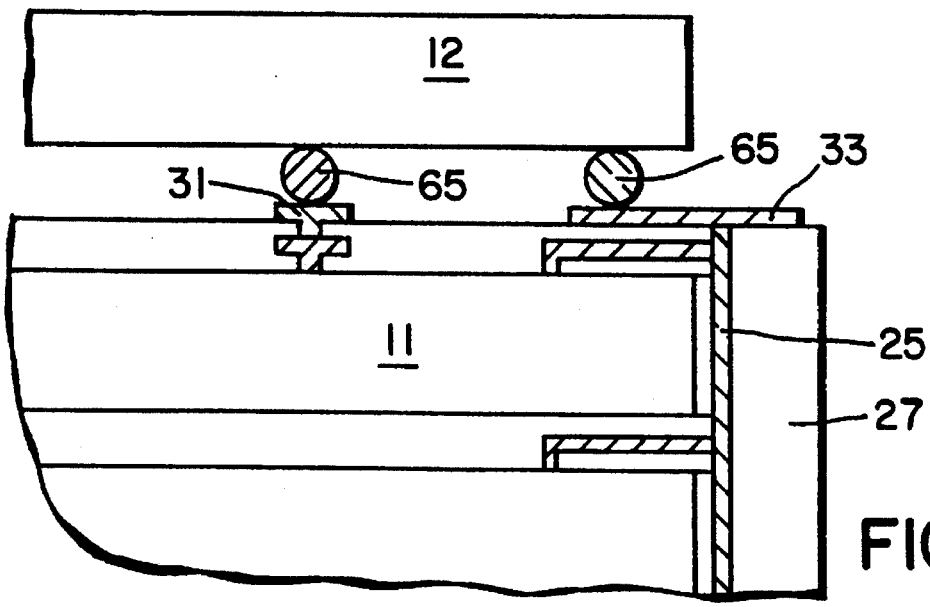
FIG. 14 is a partial cross-sectional view of a completed electronic module having a buffer chip solder bump bonded to an end surface metallization layer according to an embodiment of the present invention.
Figure 13:
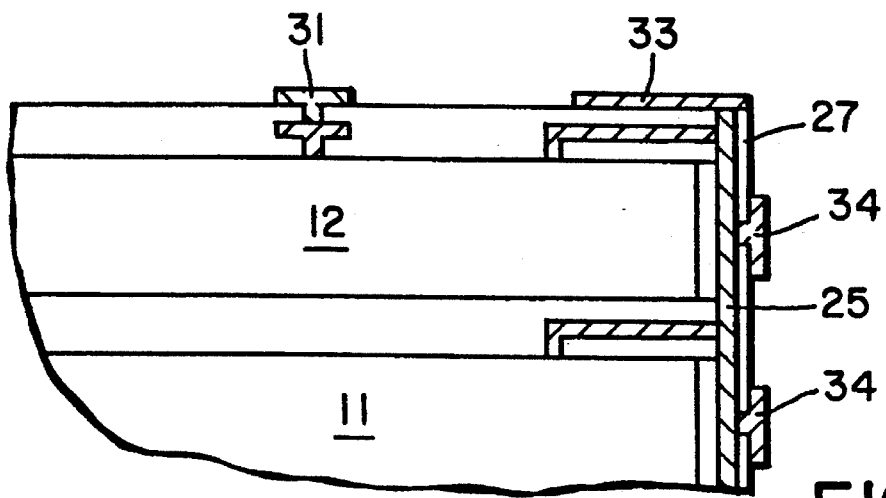
FIG. 13 is a partial cross-sectional view of a completed electronic module having an integral buffer chip contained therein and side surface contacts in conformance with an embodiment of the present invention.

Typical examples of electronic modules comprising memory modules are shown in FIGS. 12–14. In one embodiment, logic buffer chip 12 is included within the stack (FIG. 12). Logic buffer chip 12 performs memory stack management as described in co-pending applications "Integrated Multichip Memory Module, Structure and Fabrication", Ser. No. 08/120,876 filed Sep. 13, 1993 and "Integrated Memory Cube, Structure and Fabrication", Ser. No. 08/120,993 filed Sep. 13, 1993. Logic buffer chip 12 can also incorporate customer specific functions including SRAM, pseudo-static RAM, error correction code, memory handshaking and array built-in self test. It can also be used to perform bit replacement as described in co-pending application "Monolithic Electronic Modules—Fabrication and Structure", Ser. No. 08/252,794 filed Jun. 2, 1994. End surface electrical contacts 31 provide electrical connection to the memory module. Specifically, these contacts provide electrical connection to logic buffer chip 12 which coordinates access to the memory chips 11 comprising the stack. Side surface metallization layer 25 provides electrical connection from buffer chip 12 to memory chips 11 within the stack.

In another embodiment, additional means for external electrical connection are provided (FIG. 13). Specifically, the end surface of the electronic module includes end surface metallization layer 33 and contacts 31, both formed from the same metallization layer. Further, side surface contacts 34 are provided. End surface metallization layer 33 facilitates a reduction in the complexity of the wiring necessary on buffer chip 12. Specifically, external electrical connections may be directly made to memory chips 11 through end surface metallization layer 33 (without going through buffer logic chip 12).

In yet another embodiment shown in FIG. 14, buffer chip 12 is disposed external to the stack of memory chips. Particularly, buffer chip 12 is solder bump bonded (65) to end surface electrical contacts 31 and end surface metallization layer 33. External electrical connection of the module is facilitated through additional end surface contacts 31 or 33 located on the end surface of the stack outside of the "footprint" of buffer chip 12. These contacts can be electrically connected to top chip 11, side surface metal 25 or to buffer chip 12.

In summary, the three electronic modules described hereinabove all include memory chips and a buffer chip. Further, either the end surface insulation layer 15, or both end and side surface insulation layers 15 and 27 have been thinned so the module is made smaller and can fit into a small electronic package.

Figure 15:
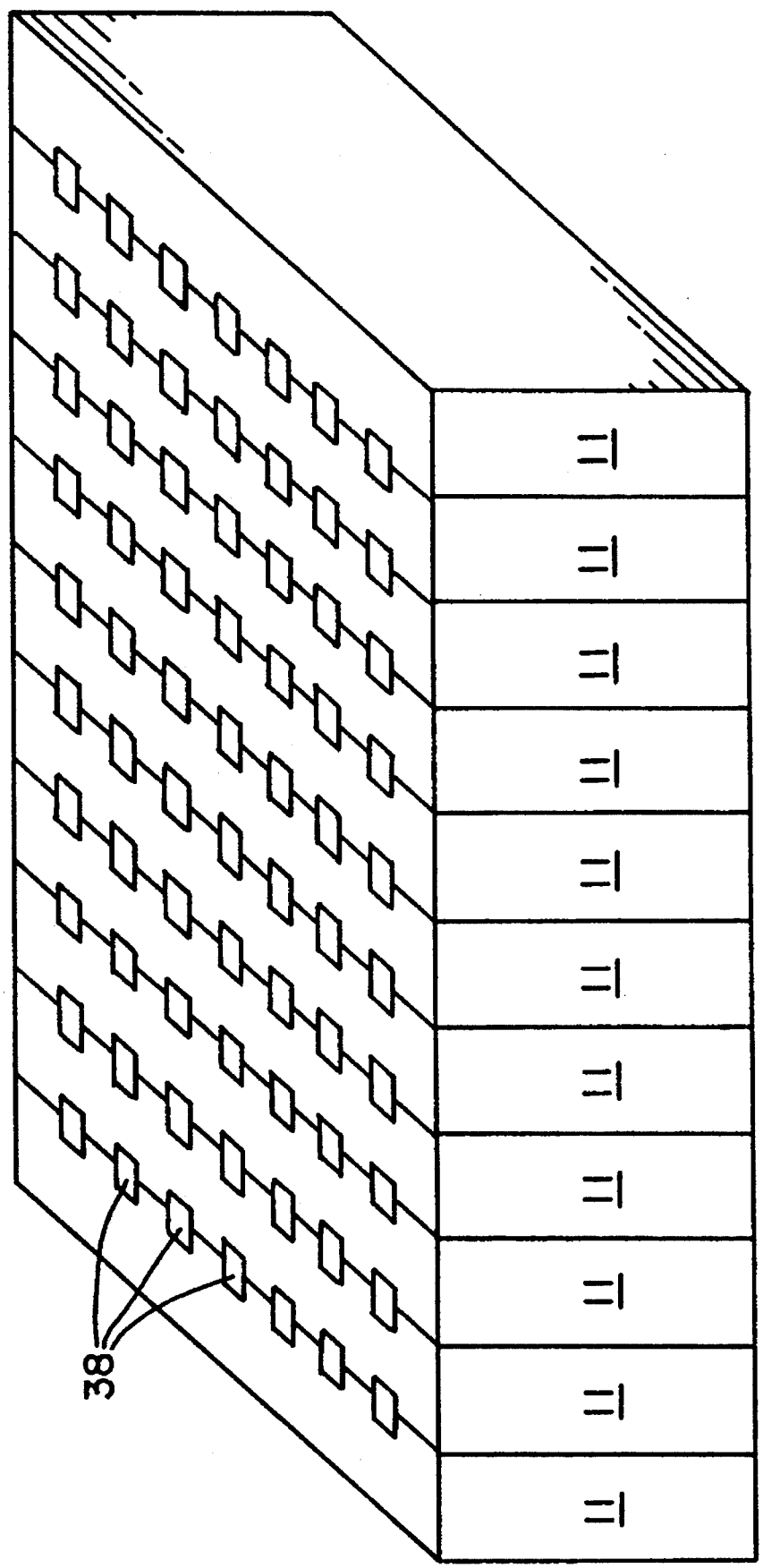
FIG. 15 is a perspective view of a "long stack" of semiconductor chips according to one embodiment of the present invention.

One method for forming stacks of IC chips and associated electronic modules is to subdivide a "long stack" consisting of many IC chips into multiple "small stacks," each comprising a subset of the chips of the long stack (or even comprising a single IC chip of the long stack). As a typical process example, multiple IC chips are fabricated, diced and stacked to form a "long stack" of IC chips (FIG. 15). Side surface processing is then performed, forming T-connects 38 associated with the transfer metallization leads of the IC chips within the long stack. Thus, a long stack of IC chips having T-connects facilitating electrical access to the IC chips of the stack is formed.

Figure 16:
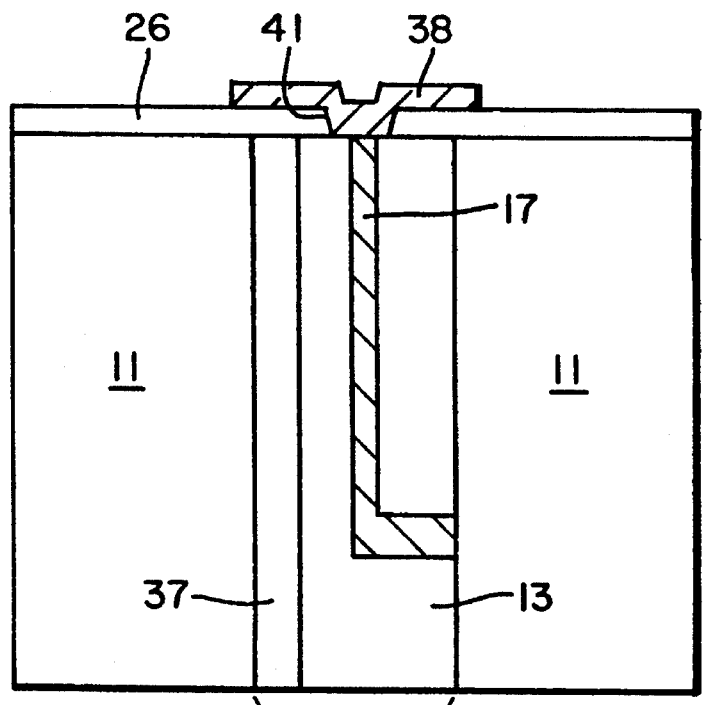
FIG. 16 is a partial cross-sectional view of an interchip layer of the long stack of FIG. 15 pursuant to an embodiment of the present invention.

The long stack of the present invention includes a unique interchip adhesion and segmentation layer 37 disposed between adjacent IC chips of the stack. Specifically, each pair of adjacent IC chips 11 (FIG. 16) is separated by interchip layer 39 comprising interchip layer 37 and a layer of polyimide 13 which protects and supports transfer metallization 17 (It is possible to limit this special interchip layer is a subset of the IC chips in the long stack). Adjacent to polyimide layer 13 is adhesive/segmentation layer 37 which is composed of an adhesive that can be sheer separated to enable segmentation of the long stack. For example, the adhesive may be Ditac (manufactured by E. I. DuPont De Nemours and Co.) whose viscosity and adhesive are reduced at elevated temperatures.

Figure 20:
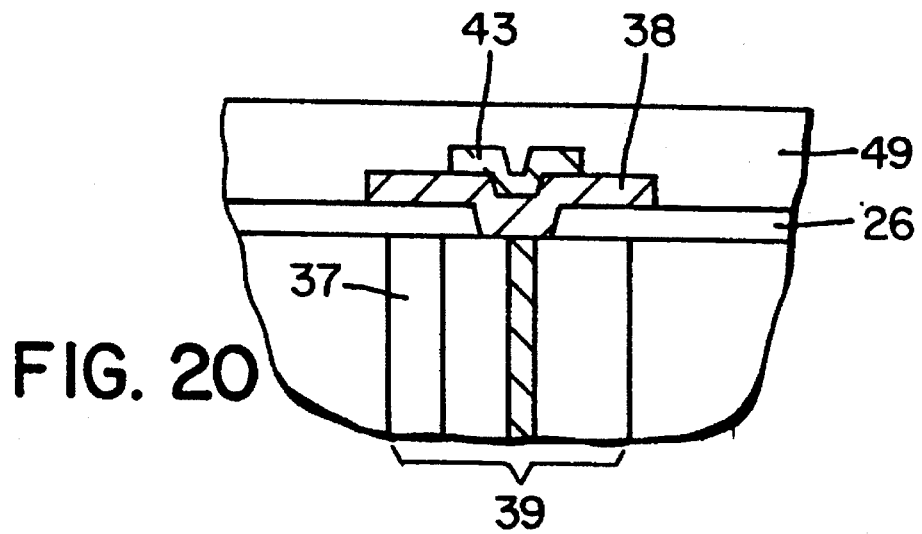
FIG. 20 is an expanded view of an interchip layer of the long stack of FIG. 15, wherein the stack has a side surface metallization layer disposed thereon in conformance with an embodiment of the present invention.
Figure 21:
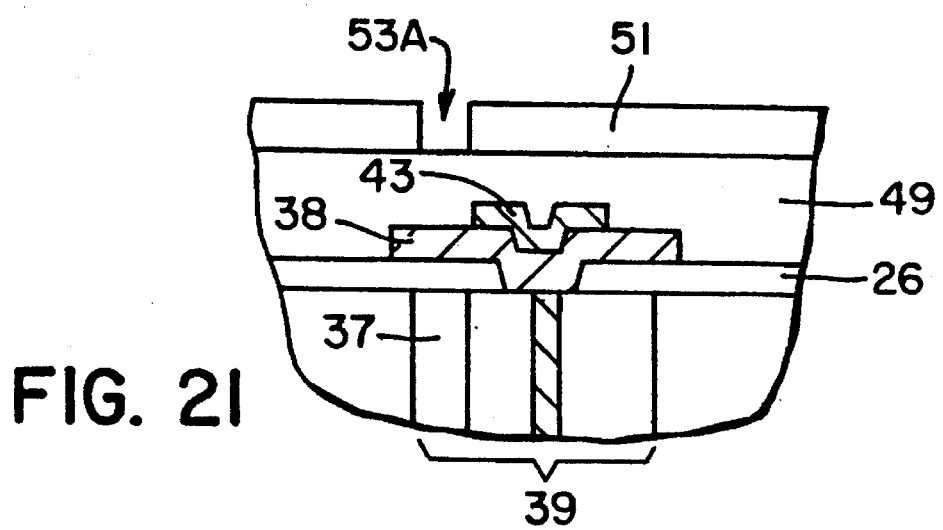
FIG. 21 is a partial cross-sectional view of the stack of FIG. 20 subsequent to the deposition and patterning of a photoresist layer pursuant to an embodiment of the present invention.
Figure 22:
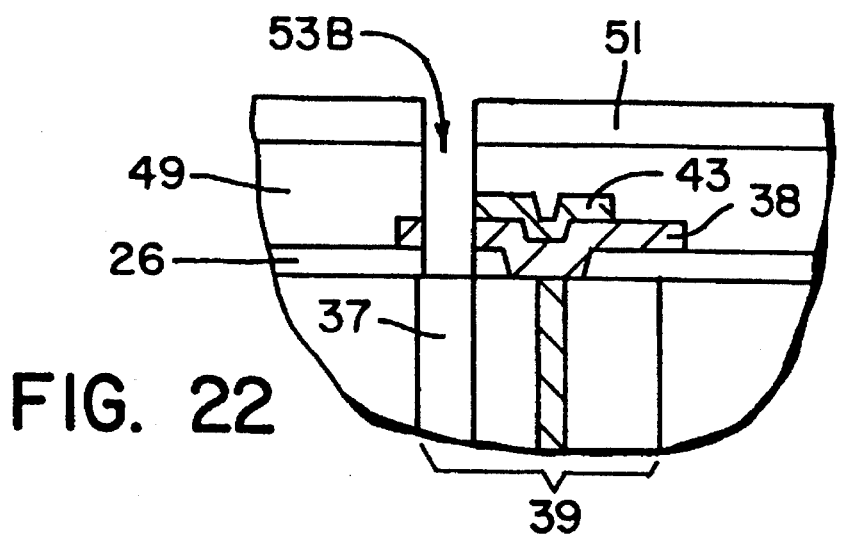
FIG. 22 is a partial cross-sectional view of the stack of FIG. 21 subsequent to etching a channel according to an embodiment of the present invention.

In regard to a specific segmentation process example, FIG. 20 shows the interchip region associated with a selected segmentation point in a long stack. Photoresist layer 51 is deposited, exposed and developed on side surface insulating layer 49 (FIG. 21). The photoresist is patterned such that channel 53A is opened above adhesive/segmentation layer 37. Etching is then performed through insulating layer 49, side surface metallization 43, T-connect 38 and insulating layer 26 down to adhesive/segmentation layer 37 forming channel 53B (FIG. 22). Thus, upon heating, the adhesivity of adhesive layer 37 is reduced and the long stack may be separated into multiple small stacks. Specifically, when heated, a shear segmentation force is applied along the selected segmentation layer (at channel 53B) and separation is performed. Thereafter, excess photoresist on the small stack may be removed. A "small stack" is thus formed having a metallization layer disposed on a side surface thereof.

The long stack is then electrically burned-in and tested so that the functional and nonfunctional IC chips within the long stack may be identified. A "functional map" of the IC chips within the long stack is produced. This functional map is employed in the patterning of side surface metallization layer 43 (FIG. 17) to interconnect groups of functional IC chips as small stacks within the long stack. Because all IC chips within the small stacks are functional, small stacks may be produced without the inclusion of spare IC chips to replace those that fail during test and burn-in. Furthermore, the side surface metallization layer may be patterned to maximize the yield of functional small stacks from the long stack (short stacks are grouped within the long stack such that the maximum number of functional groups of IC chips are used therewithin).

Figure 19:
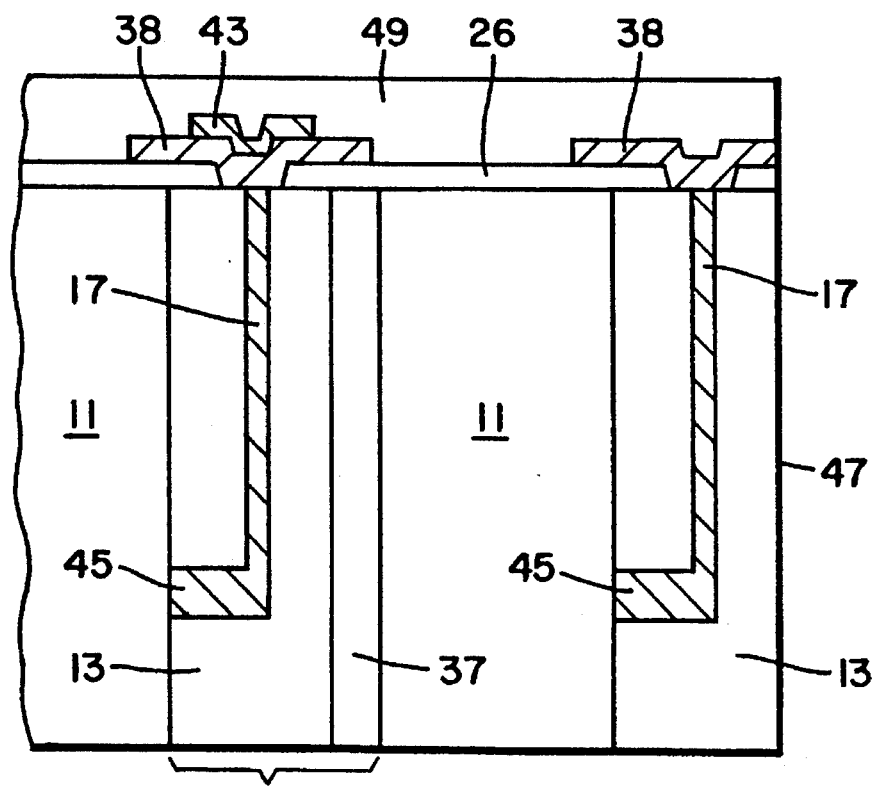
FIGS. 18–19 are cross-sectional views of the stack of FIG. 17 according to one embodiment of the present invention.
Figure 17:
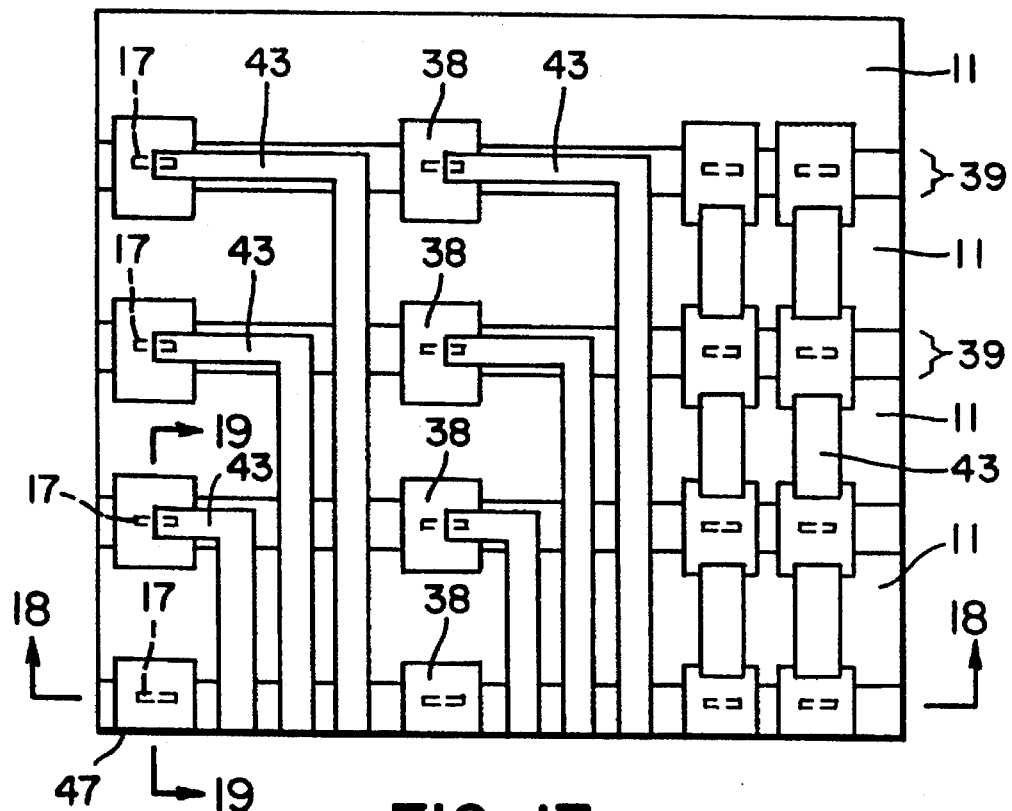
FIG. 17 is a partial schematic view of a side surface metallization layer disposed on a small stack formed from the long stack of FIG. 15 in conformance with an embodiment of the present invention.
Figure 18:
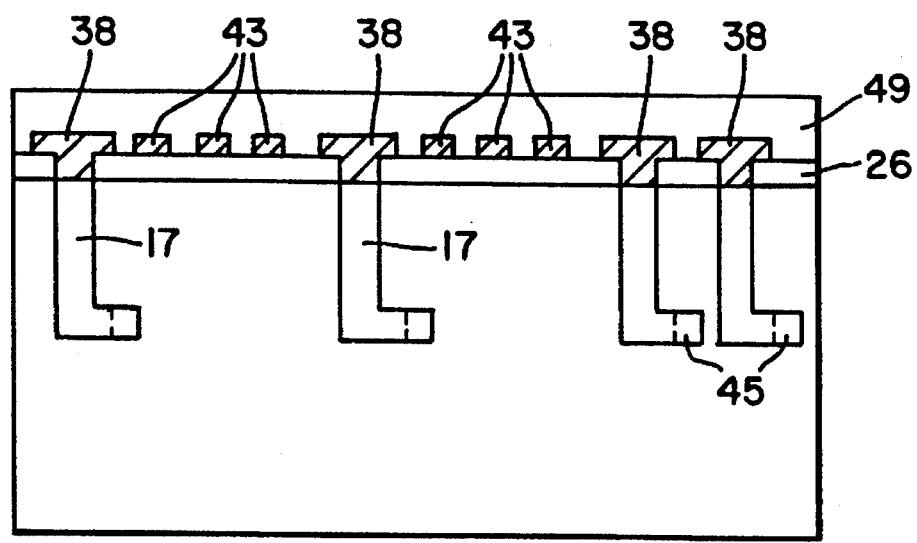

The views of FIGS. 17–19 show the structure of an interconnected small stack (shown separated from the long stack as discussed hereinbelow). In particular, each IC chip 11 has T-connects 38 associated with its transfer metals 17 which connect to I/O pads 45 on the surfaces of the IC chips (FIG. 18). T-connects were previously used for testing the IC chips of the long stack. Now, the T-connects provide an electrical contact point for side surface metallization layer 43. Disposed above the side surface metallization layer 43 is insulating layer 49 (FIGS. 18–19). Insulating layer 49 may be formed using the thin-film insulating layer techniques discussed hereinabove. Alternatively, depending on subsequent processing requirements, conventional spin apply deposition techniques may be used.

After small stack interconnection (with side surface metallization layer 43), the long stack is segmented into multiple small stacks. Segmentation points are designated at the boundaries of functional small stacks. This may even include segmentation of a small stack comprising a single IC chip (if the IC chip is adjacent to multiple failed IC chips and inclusion in a stack with other functional IC chips is not possible). Thus, waste of even a single functional IC chip is avoided.

Figure 24:
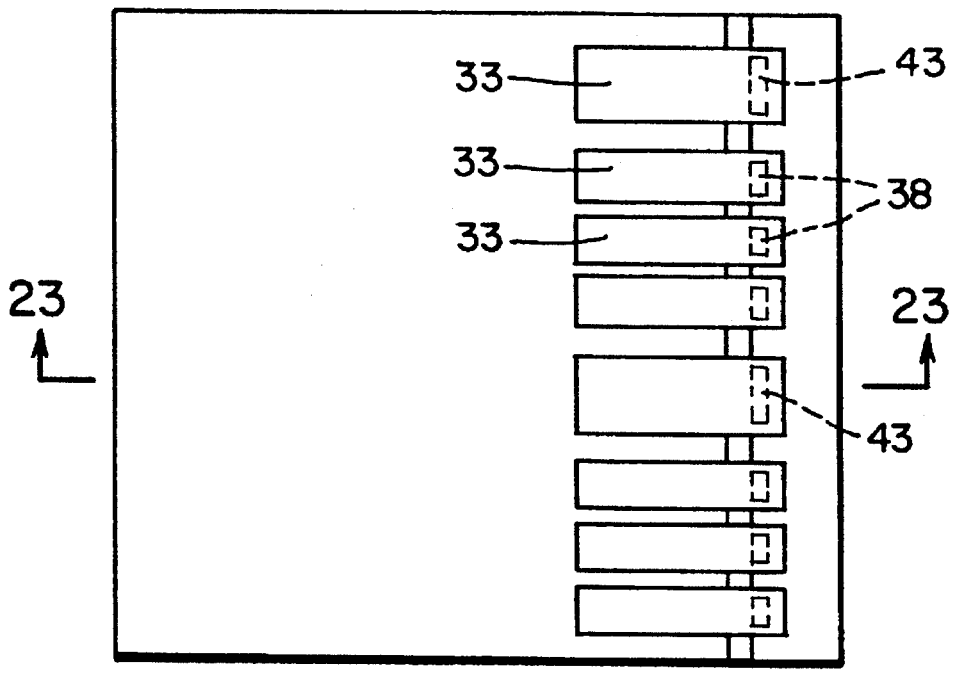
FIG. 24 is a schematic view of an end surface of the small stack of FIG. 23 pursuant to one embodiment of the present invention.
Figure 23:
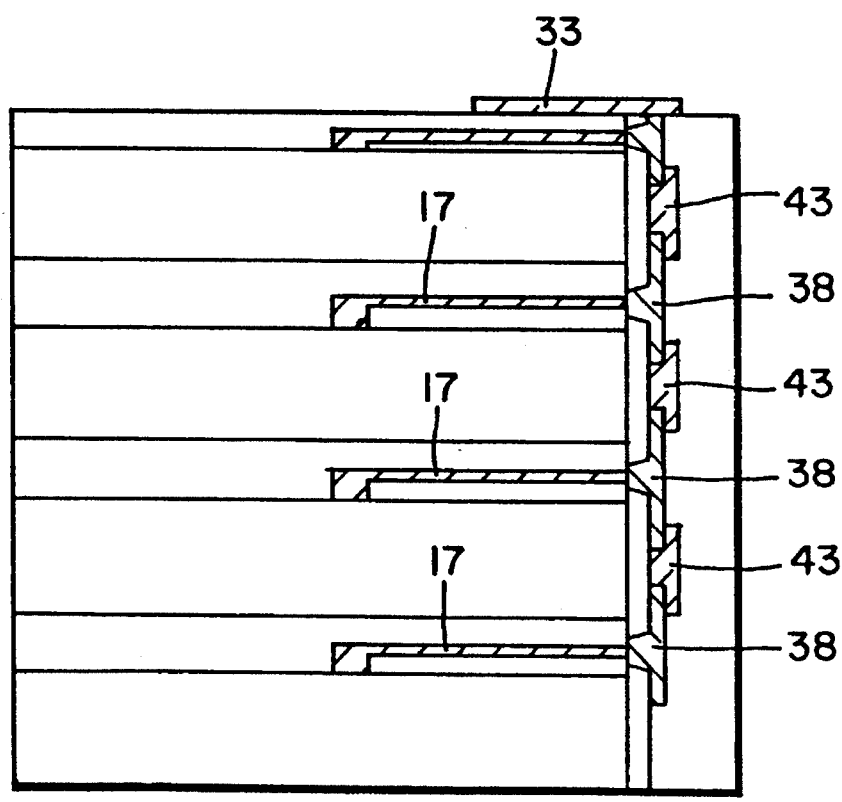
FIG. 23 is a cross-sectional view of a small stack having side and end surface metallization layers according to an embodiment of the present invention.

The techniques of the present invention described hereinabove for forming interconnected side and end surface metallization layers may be applied to the present small stack formed from a long stack. Accordingly, end surface metallization layer 33 (FIGS. 23–24) is formed on the small stack for facilitating external electrical connection to the end surface of the resulting electronic module. Specifically, controlled removal (e.g., using polishing or etching techniques) of the end surface of the small stack exposes the ends of side surface metallization layer 43 and T-connects 38 (FIG. 24). End surface metallization layer 33 is then formed attaching thereto. Thus, a fully functional electronic module having electrically interconnected side and end surface metallization layers is formed from a long stack without the need for provisioning "spare" IC chips within each electronic module.

As an alternative to the etching techniques described above, laser ablation can be used to selectively remove insulating layer 49, side surface metallization 43, T-connect 38 and insulating layer 26, thereby exposing the adhesive segmentation layer 37. The selective laser ablation can be accomplished by either exposing the side surface of the stack to high energy laser light that is patterned using a laser mask, or rastering in a controlled fashion and predetermined pattern a small spot-size laser light beam.

Figure 25A:
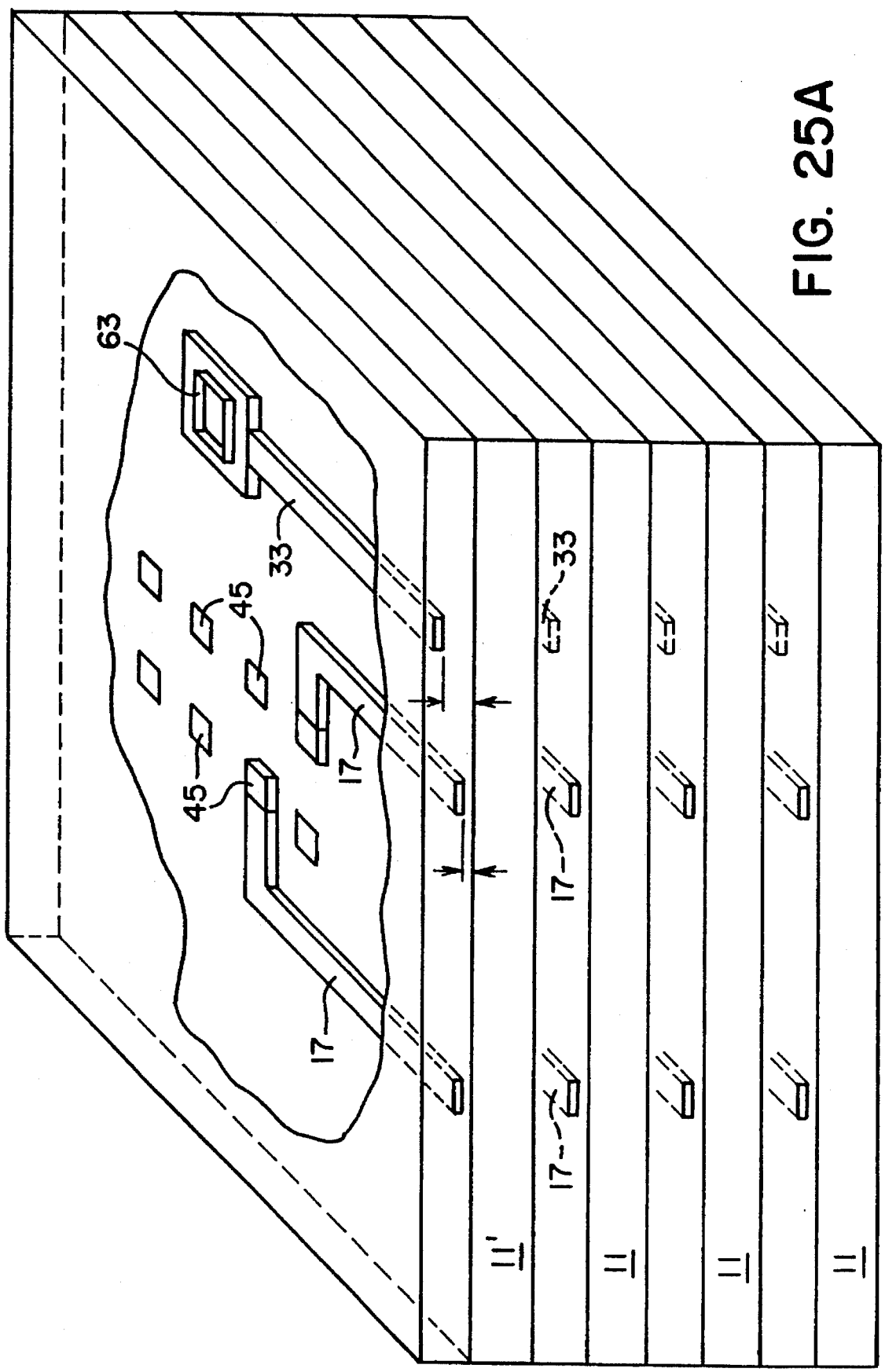
FIG. 25A is a perspective schematic view of a small stack wherein each IC chip of the small stack has both an end surface metallization layer and a transfer metallization layer pursuant to one embodiment of the present invention.

In another embodiment of the present invention, an electronic module is fabricated having an end surface metallization layer, that does not require forming the end surface metallization layer on the end IC chip of each small stack of IC chips. Specifically, shown in the perspective schematic view of FIG. 25A is a stack of four IC chips 11, each of which contains transfer metallization 17 as well as end surface metallization 33. In particular, the end surface metallization layer is formed above the transfer metallization layer (both within an insulating layer) at wafer level using standard wafer processing techniques. Thus, each IC chip of the stack has an end surface metallization layer preformed thereon. Alternatively, enough space to accommodate the transfer metallization layer and end surface metallization layer exists in a single layer, such combination can be made. In either case, no further end surface processing is required after segmentation.

Figure 28:
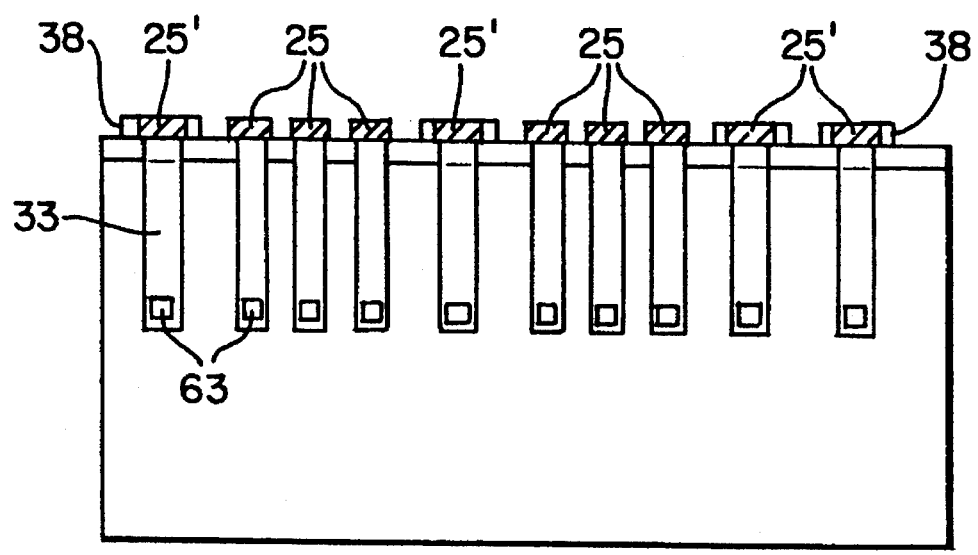
FIG. 28 is a cross-sectional view of an end surface of the small stack of FIG. 27 in conformance with one embodiment of the present invention.
Figure 29:
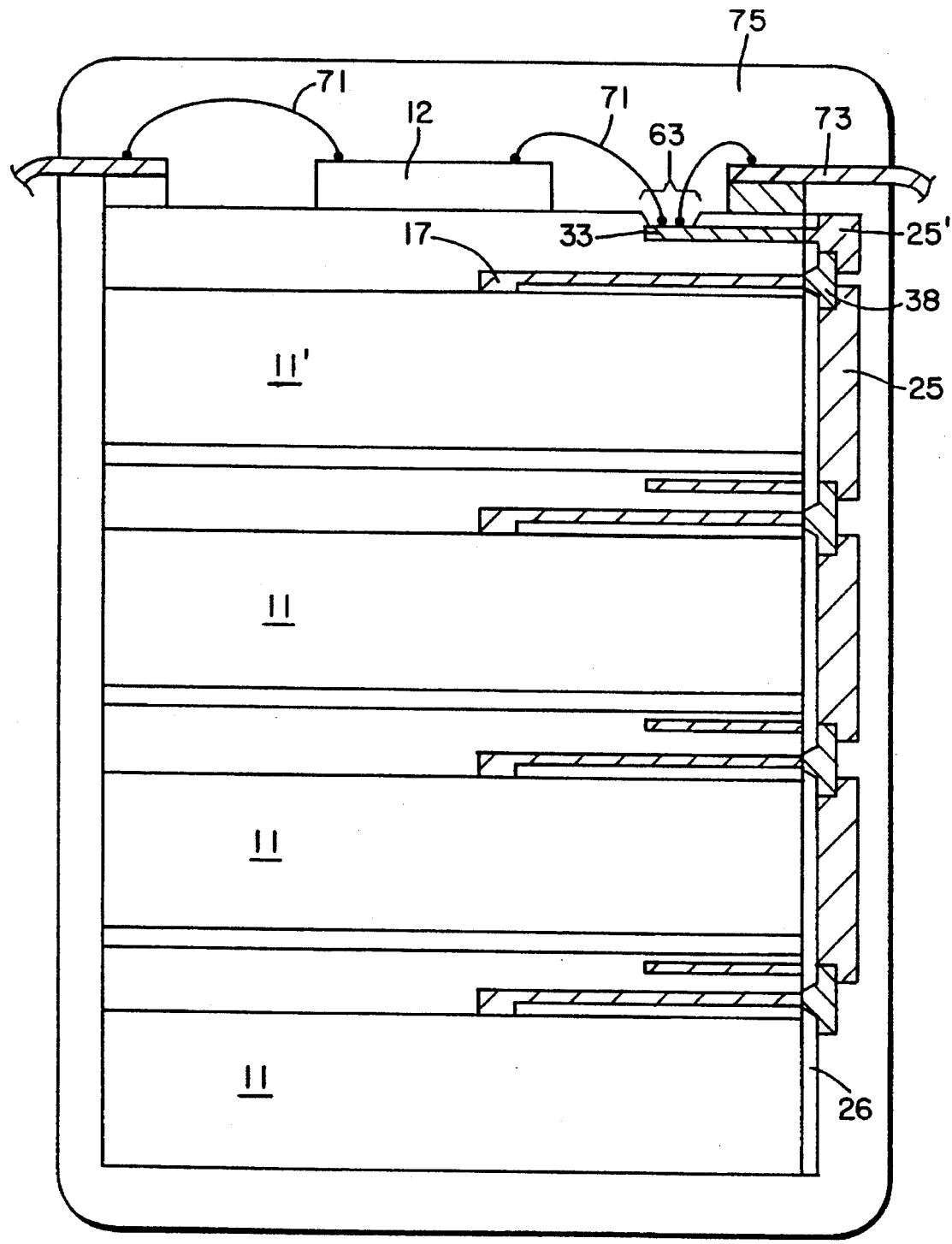
FIG. 29 is a cross-sectional view of a completed electronic module comprising the small stack of FIG. 27 pursuant to one embodiment of the present invention.

Specifically, as used herein, a transfer metallization layer 17 refers to a metal layer used to electrically connect I/O pads 45 of the IC chips of the stack to connection pads on a side surface of the stack (such as a side surface metallization layer). Further, as used herein, an end surface metallization layer 33 refers to a metallization layer used to electrically connect connection pads on the side surface of a stack of IC chips to an electrical connection pads on an end surface (through vias 63). Thus, in an embodiment having separate transfer and end surface metallization (FIG. 25A), for example, to electrically couple a transfer metallization lead to an end surface of a module, an end surface metal lead is disposed above a transfer metal lead, and the two are electrically coupled on a side surface of the module (FIGS. 27–29—side surface metal 25').

The segmentation techniques for forming multiple small stacks from a single long stack may be used to segment a long stack of IC chips, wherein each IC chip includes both a transfer metallization layer and an end surface metallization layer. In particular, the stacking, T-connect forming, and testing/burn-in steps remain substantially the same as previously described herein.

After test/burn-in of the long stack, channels (or vias) 61 (FIG. 26) are opened (etched) to expose the ends of end surface metallization layer 33. Channels (or vias) are opened only for end IC chips of the small stacks identified within the long stack. Particularly, the small stacks and associated end chips are identified based upon the test/burn-in process steps. Side surface metallization is then patterned and deposited, connecting the transfer metallization T-connects and the exposed end surface metallization on the end chip of each small stack.

Figure 25B:
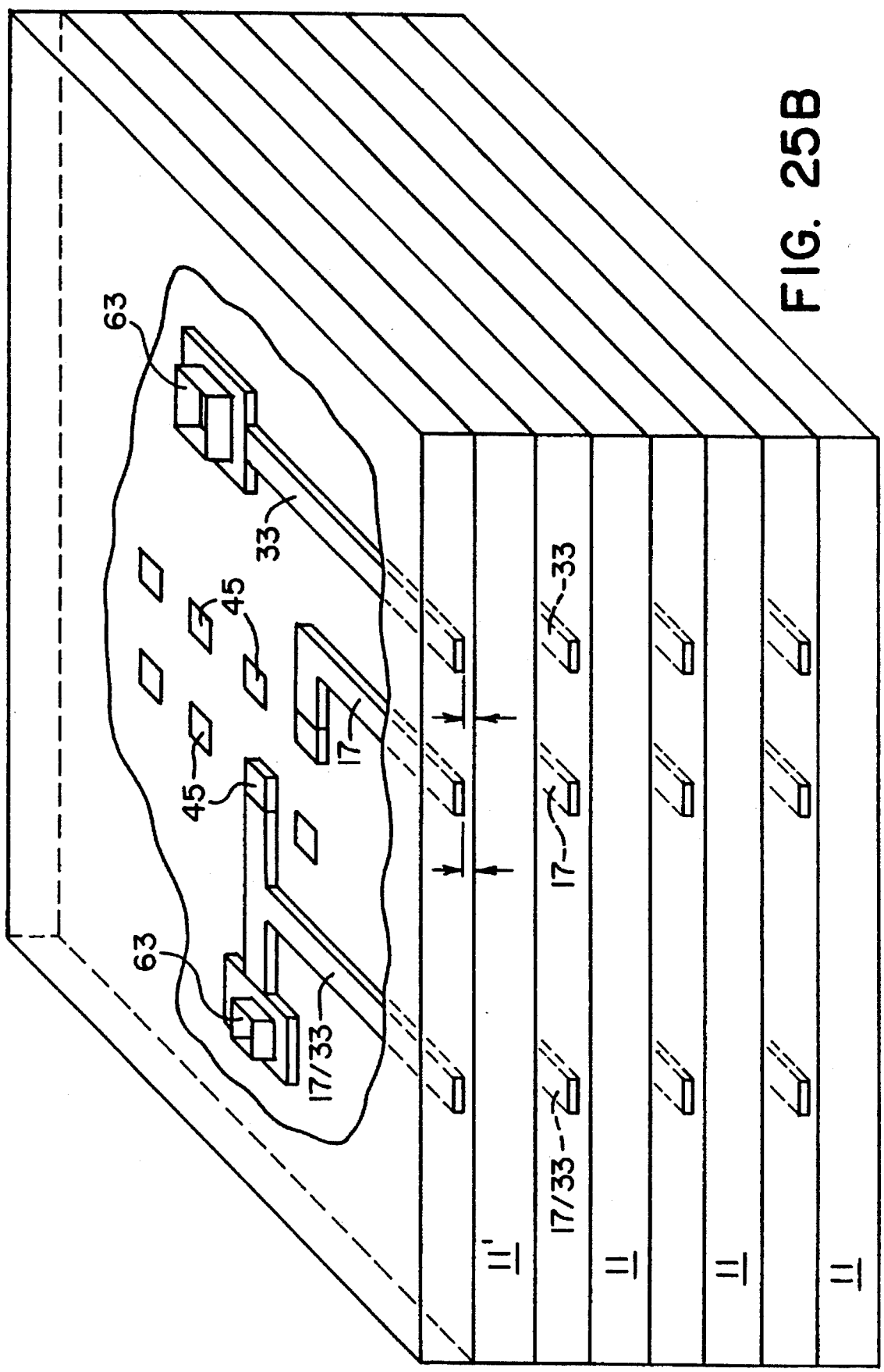
FIG. 25B is a perspective schematic view of a small stack wherein each IC chip of the small stack has a combined end surface metallization layer and transfer metallization layer in accordance with an embodiment of the present invention.
Figure 27:
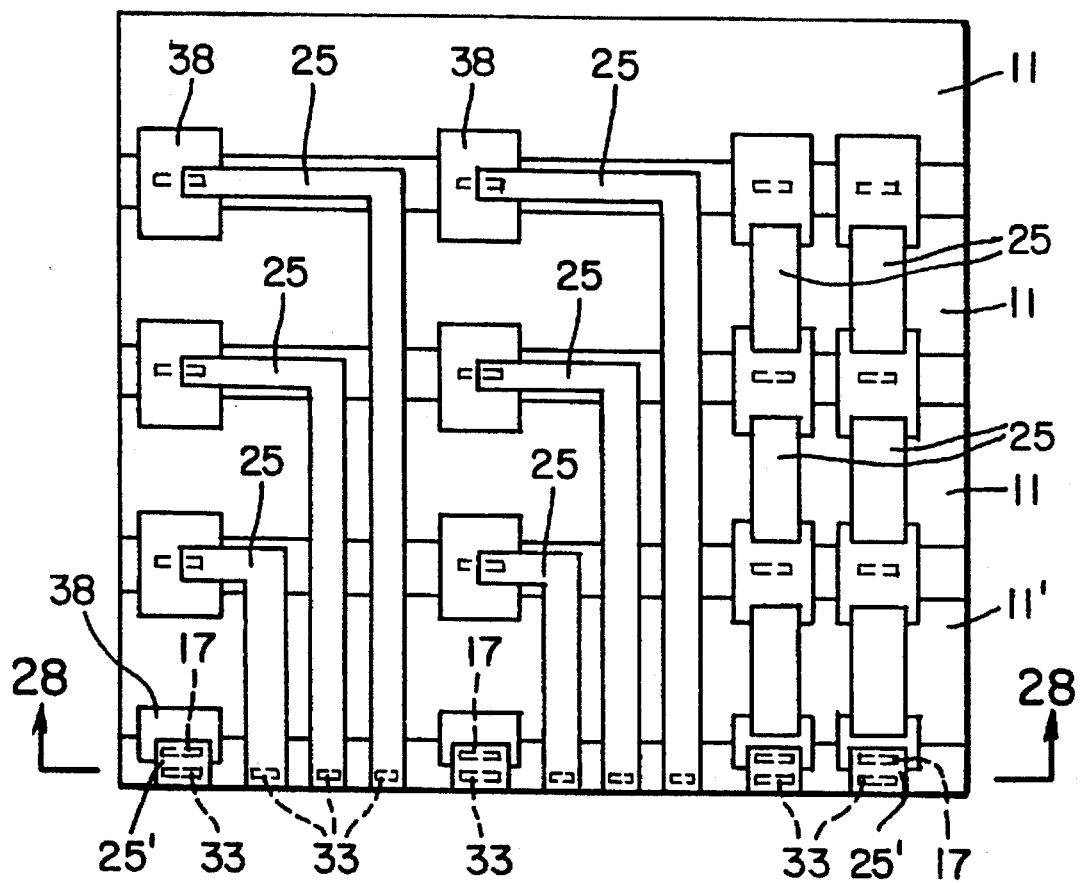
FIG. 27 is a side view of a small stack wherein each IC chip of the small stack contains both end surface metallization and transfer metallization in conformance with an embodiment of the present invention.

As an example, a small stack side surface interconnect pattern is shown in FIG. 27. It should be noted that FIGS. 27–29 illustrate a small stack wherein each IC chip includes a transfer metallization layer and end surface metallization layer. As shown in FIGS. 27–28, there can be many more transfer metallization lines 17 and many more end surface metallization layer lines 33 than shown in FIGS. 25–26. End IC chip 11' (FIGS. 27–28) has both its transfer metal layer 17 and end surface metallization layer 33 electrically interconnected on the side surface of the small stack. This is achieved by patterning side surface metallization layer 25 to electrically capture both the end surface metallization and transfer metallization (via T-connects 38) of the end IC chip 11' (see also FIG. 29). Side surface metallization layer 25 can be patterned to facilitate both bussed connections between IC chips and individual connections to IC chips (from end surface metallization layer 33). The end surface metallization layer of each of the other chips in the stack remains electrically insulated from the side surface. As a general note, a protective side surface insulating layer may be added over the side surface of the electronic module having metallization layer 25.

The cross-sectional view of the end IC chip 11' of the stack shown in FIG. 28 reveals further features. In particular, end surface metallization layer 33 is shown interconnecting to opening 63 on the end surface of the electronic module (see also FIG. 25). Thus, external electrical connection of the electronic module is facilitated.

As in previous embodiments, once the side surface metallization layer and an optional protective insulating layer disposed thereabove have been formed, the long stack is segmented. Segmentation is performed at the predetermined segmentation points determined after the testing/burn-in steps so as to form several small stacks. Again, the photolithographic etching or laser ablation processes facilitate segmentation described hereinabove are employed (FIGS. 20–22). Subsequent to segmentation, openings 63 (FIGS. 25, 28 and 29) may be formed in the top insulating surface of the end IC chip of the stack to access end metallization layer 33 and/or transfer metallization layer 17, FIG. 25.

In one embodiment of the present invention, formation of opening 63 in the end of a stack of IC chips is unnecessary. Specifically, openings 63 are formed in every chip during wafer processing. After stacking and segmentation, when the adhesive layer is removed from the end IC chip of the stack, openings 63 are exposed. Thus, the process steps of forming openings on the end of a stack of IC chips are eliminated, beneficially simplifying the fabrication process of the present invention.

As a typical application example, logic buffer chip 12 may be added to the top of the small stack and appropriately interconnected to the end surface metallization layer (FIG. 29—Note: the figure is shown vertically exaggerated for the purpose of clarity). The entire package may then be appropriately packaged in, for example, plastic encapsulation 75. External electric connection is facilitated by use of wirebonds 71 and leadframe contacts 73.

To summarize, the techniques of the present invention facilitate the formation of electronic modules with interconnected side and end surface metallization layers without the need for a "thick" end cap. Further, the techniques described herein facilitate a reduction in the overall size of electronic modules facilitating inclusion of electronic modules in smaller packages.

For example, in one embodiment, thin-film insulator transfer techniques facilitate the formation of electrically interconnected side and end surface metallization layers in an electronic module. Further, the insulating layers associated with the respective side and end surfaces may be significantly thinned thus reducing the overall dimensions of the electronic module.

In another embodiment, a long stack of IC chips is tested, and segmented into multiple small stacks of IC chips. The long stack is fabricated such that segmentation can be performed between any two adjacent chips. Thus, after the testing steps, small stacks comprising only functional IC chips may be formed. This facilitates the elimination of "spare" IC chips within electronic modules. Again, this contributes to the reduction in overall dimensions of electronic modules. Furthermore, when combined with the electrically interconnected side surface and end surface metallization layer techniques of the present invention, a fully interconnected, reduced size electronic module is formed.

The present invention further comprises techniques for forming electronic modules wherein each IC chip of the module includes both a transfer metallization layer and an end surface metallization layer. The end surface metallization layer is only used on the end IC chip of the stack. Thus, an electronic module may be created with a end surface metallization layer without adding end surface structures to the stack (such as a "thick" end cap). Overall dimensions of the module are therefore reduced. Further, these techniques may be combined with the aforementioned long stack/small stack segmentation process described hereinabove such that the requirement for spare IC chips in the stack is eliminated.

Advantageously, the synergistic techniques of the present invention described herein facilitate the formation of an advanced electronic module having interconnected surface metallization layers and reduced overall dimensions.

While the invention has been described in detail herein, in accordance with certain preferred embodiments thereof, many modifications and changes therein may be affected by those skilled in the art. Accordingly, it is intended by the appended claims to cover all such modifications and changes as fall within the true spirit and scope of the invention.

What is claimed is:

1. A method for forming an electronic module comprising the steps of:
   (a) providing a stack comprising a plurality of stacked integrated circuit ("IC") chips, each IC chip having an edge surface, said edge surfaces at least partially defining a first surface of said stack;
   (b) forming a first thin-film metallization layer on said first surface of said stack;
   (c) forming a first insulating layer on said first thin-film metallization layer; and
   (d) forming a second thin-film metallization layer above a second surface of said stack, said second surface being perpendicular to said first surface of said stack, wherein said first thin-film metallization layer extends to said second surface of said stack and said second thin-film metallization layer extends beyond said first surface of said stack so as to electrically connect to said first thin-film metallization layer.

2. The method of claim 1, wherein said first insulating layer forming step (c) comprises forming said first insulating layer by applying a plurality of insulating layers to said first surface of said stack above said first thin-film metallization layer.

3. The method of claim 2, wherein said step of applying said plurality of thin insulating layers comprises sequentially transferring a first plurality of thin-film insulating layers to said first surface of said stack above said first thin-film metallization layer.

4. The method of claim 2, wherein prior to said first thin-film metallization layer forming step (b), said method further includes depositing a second insulating layer on said second surface of said stack such that said second thin-film metallization layer is formed on said second insulating layer.

5. The method of claim 4, wherein said second insulating layer forming step comprises forming said second insulating layer by sequentially transferring a second plurality of thin-film insulating layers to said second surface of said stack.

6. The method of claim 4, wherein prior to said second thin-film metallization layer forming step (d), said method further includes thinning said second insulating layer to produce a thinned insulating layer, and wherein said second thin-film metallization layer forming step (d) comprises forming said second thin-film metallization layer on said thinned insulating layer.

7. The method of claim 6, wherein after said second thin-film metallization layer forming step (d), said method further includes thinning said first insulating layer to produce a thinned first insulating layer such that a portion of said second thin-film metallization layer extending beyond said first surface of said stack is exposed on an outer surface of said thinned first insulating layer.

8. The method of claim 7, wherein after said first insulating layer thinning step, said method further includes forming a third thin-film metallization layer on said thinned first insulating layer such that said third thin-film metallization layer electrically connects to said exposed second thin-film metallization layer on said thinned surface of said first insulating layer, said third thin-film metallization layer facilitating external electrical connection of said electronic module.

9. The method of claim 7, wherein after said first insulating layer thinning step, said method further includes forming a plurality of electrical contacts on said thinned first insulating layer such that said plurality of electrical contacts is electrically connected to said first thin-film metallization layer for facilitating external electrical connection of said electronic module.

10. The method of claim 1, wherein said stack providing step (a) comprises providing said stack within a second plurality of stacked IC chips, and wherein prior to said second thin-film metallization layer forming step (d) said method further comprises separating said stack from said second plurality of stacked IC chips.

11. A method for forming an electronic module comprising the steps of:
  (a) providing a stack comprising a plurality of stacked integrated circuit ("IC") chips, at least two IC chips, including an end IC chip, of said stack having a main surface, a transfer metallization layer disposed above said main surface and an end surface metallization layer disposed above said main surface, each IC chips of said stack having an edge surface, said edge surfaces at least partially defining a side surface of said stack; and
  (b) forming a first metallization layer on said side surface of said stack such that said first metallization layer electrically interconnects at least some of the stacked IC chips of said stack and such that said first metallization layer electrically connects to the end surface metallization layer of said end IC chip of said stack for facilitating external electrical connection to said at least some of the stacked IC chips through said end surface metallization layer of said end IC chip of said stack, said stack and said first metallization layer comprising the electronic module.

12. The method of claim 11, wherein said end surface metallization layer of each IC chip of said at least two IC chips of said stack extends towards the edge surface of each IC chip, and wherein said first metallization layer forming step (b) further comprises exposing the end surface metallization layer of the end IC chip of the stack on the side surface of the stack for facilitating electrical contact of the first surface metallization layer thereto.

13. The method of claim 12, wherein said providing step (a) further comprises providing the end IC chip of the stack with an insulating layer disposed above its end surface metallization layer and above its transfer metallization layer, and wherein said method further includes forming a plurality of electrically conductive vias through said insulating layer such that said plurality of electrically conductive vias facilitate external electrical contact to said end surface metallization layer of said end IC chip of the stack.

14. The method of claim 13, wherein said providing step (a) further comprises providing the end IC chip of the stack with an insulating layer disposed above its end surface metallization layer and above its transfer metallization layer, and wherein said method further includes forming a plurality of electrically conductive vias through said insulating layer such that said plurality of electrically conductive vias facilitate external electrical contact to said transfer metallization layer of said end IC chip of the stack.

15. The method of claim 11, wherein said providing step (a) comprises providing each IC chip of said at least two IC chips with its end surface metallization layer disposed above its transfer metallization layer for facilitating separate electrical connection to said end surface metallization layer and to said transfer metallization layer from the side surface of the stack.

16. The method of claim 11, wherein said providing step (a) comprises providing each IC chip of said at least two IC chips with its end surface metallization layer disposed co-planar with its transfer metallization layer.

17. The method of claim 11, wherein said providing step (a) comprises providing said stack within a second plurality of stacked IC chips to facilitate formation of said first metallization layer.

18. The method of claim 17, wherein subsequent to said first metallization layer forming step (b), said method further includes separating said electronic module from said second plurality of stacked IC chips.

19. The method of claim 11, wherein said method further includes forming openings in the main surface of each IC chip of the at least two IC chips of the stack during wafer processing, said openings facilitating electrical connection to the end surface metallization layer of the end IC chip of the stack.

20. The method of claim 11, wherein said providing step (a) includes providing said stack having each IC chip include a main surface, a transfer metallization layer disposed above said main surface and an end surface metallization layer disposed above said main surface.

21. A method for forming an electronic module comprising the steps of:
  (a) providing a long stack comprising a first plurality of stacked integrated circuit ("IC") chips, each IC chip of a second plurality of IC chips of said long stack being separable from an adjacent IC chip of said long stack;
  (b) after said providing step (a), determining at least one segmentation point within said long stack, said segmentation point being locatable between any IC chip of said second plurality of IC chips and an adjacent IC chip of said long stack; and
  (c) separating said long stack into at least two small stacks, said separating being performed at said at least one segmentation point, said electronic module comprising a first small stack of said at least two small stacks.

22. The method of claim 21, wherein after said providing step (a), said method includes testing each IC chip of said long stack, and wherein said determining step (b) comprises determining a segmentation point based upon said testing.

23. The method of claim 22, wherein said providing step (a) comprises providing each IC chip of said long stack with an edge surface, said edge surfaces at least partially defining a side surface of the long stack, and wherein prior to said testing step said method further comprises forming a plurality of electrical contacts on said side surface of said long stack, said plurality of electrical contacts being electrically connected to said plurality of IC chips for facilitating the testing of each IC chip of said long stack.

24. The method of claim 23, wherein subsequent to said testing step, said method further includes forming a first metallization layer on said side surface of said long stack such that said first metallization layer electrically contacts at least some of said plurality of electrical contacts, said first metallization layer having a pattern based upon results of said testing step such that said electronic module comprises an interconnected plurality of stacked functional IC chips.

25. The method of claim 24, wherein said determining step (b) further includes determining a plurality of segmentation points based upon said testing step, and wherein said first metallization layer forming step comprises patterning said first metallization layer so as to form a plurality of electrically independent electronic modules from said long stack, and wherein said separating step (c) comprises separating said long stack into said plurality of electrically independent electronic modules.

26. The method of claim 21, wherein said providing step (a) further comprises providing said long stack with an adhesive layer joining each IC chip of said second plurality of IC chips of the long stack to an adjacent IC chip in the long stack, and wherein said separating step (c) includes reducing the adhesivity of an adhesive layer associated with said at least one segmentation point for facilitating the separating of said electronic module from said long stack.

27. The method of claim 26, wherein said separating step (c) further includes reducing the adhesivity of the adhesive layer associated with the at least one segmentation point by heating the adhesive layer.

28. The method of claim 29, wherein said separating step (c) further comprises etching a channel in the side surface of said long stack at said at least one segmentation point for facilitating separation of the electronic module from the long stack.

29. The method of claim 28, wherein said etching a channel comprises etching a channel using laser ablation.

30. The method of claim 28, wherein at least one electrical contact is disposed on the side surface of the long stack, said at least one electrical contact being disposed perpendicular to said adhesive layer associated with said at least one segmentation point and intersecting a plane defined thereby, and wherein said separating step (c) includes etching said channel through said at least one electrical contact for facilitating separation of the electronic module from the long stack.

31. The method of claim 30, wherein said step of etching said channel comprises etching said channel at said at least one segmentation point such that said adhesive layer is exposed by said etching of said channel.

32. The method of claim 21, wherein said providing step (a) further comprises providing each IC chip of said long stack being separable from an adjacent IC chip of said long stack, and wherein said determining step (b) further includes determining at least one segmentation point within said long stack, said segmentation point being locatable between any two adjacent IC chips of said long stack.

* * * * *

UNITED STATES PATENT AND TRADEMARK OFFICE
CERTIFICATE OF CORRECTION

PATENT NO. : 5,466,634
DATED : November 14, 1995
INVENTOR(S) : Beilstein, Jr. et al.

It is certified that error appears in the above-indentified patent and that said Letters Patent is hereby corrected as shown below:

Claim 28, Col. 17:

Line 29, delete "The method of claim 29," and replace with --The method of claim 26,--.

Signed and Sealed this

Second Day of April, 1996

*Attest:*

BRUCE LEHMAN

*Attesting Officer*      *Commissioner of Patents and Trademarks*